United States Patent
Sakamoto et al.

(10) Patent No.: US 8,593,210 B2
(45) Date of Patent: Nov. 26, 2013

(54) SIGNAL DISTRIBUTION DEVICE AND DISPLAY DEVICE

(75) Inventors: Mayuko Sakamoto, Osaka (JP);
Yoshihisa Takahashi, Osaka (JP);
Yasuaki Iwase, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 215 days.

(21) Appl. No.: 13/144,464

(22) PCT Filed: Sep. 29, 2009

(86) PCT No.: PCT/JP2009/066947
§ 371 (c)(1),
(2), (4) Date: Jul. 13, 2011

(87) PCT Pub. No.: WO2010/095306
PCT Pub. Date: Aug. 26, 2010

(65) Prior Publication Data
US 2011/0273223 A1 Nov. 10, 2011

(30) Foreign Application Priority Data
Feb. 17, 2009 (JP) ................................ 2009-034274

(51) Int. Cl.
*H03K 17/687* (2006.01)
(52) U.S. Cl.
USPC ............... 327/427; 349/42; 349/46; 345/92; 345/204; 257/59
(58) Field of Classification Search
USPC ......... 327/291, 293, 295, 403, 404, 415, 416, 327/427, 434; 349/41–43, 46; 257/59, 72; 345/87, 90, 92, 204
See application file for complete search history.

(56) References Cited

U.S. PATENT DOCUMENTS

| | | | |
|---|---|---|---|
| 6,906,385 B2 * | 6/2005 | Moon et al. | 257/347 |
| 7,436,384 B2 * | 10/2008 | An | 345/98 |
| 2004/0173795 A1 | 9/2004 | Moon et al. | |
| 2005/0145849 A1 | 7/2005 | Moon et al. | |
| 2009/0109162 A1 | 4/2009 | Moon et al. | |

FOREIGN PATENT DOCUMENTS

| | | |
|---|---|---|
| JP | 64-084297 | 3/1989 |
| JP | 2000-029441 | 1/2000 |
| JP | 2003-149673 | 5/2003 |
| JP | 2004-274050 | 9/2004 |
| JP | 2004-294858 | 10/2004 |
| JP | 2005-055616 | 3/2005 |
| JP | 2005-107382 | 4/2005 |
| JP | 2008-097005 | 4/2008 |

* cited by examiner

*Primary Examiner* — Patrick O'Neill
(74) *Attorney, Agent, or Firm* — Morrison & Foerster LLP

(57) ABSTRACT

A peripheral region of a display panel includes a signal distribution device (4) for time-dividing and distributing, to output terminals (7), an output signal from a source driver. The signal distribution device (4) includes switching elements (20) for the output terminals (7). Each switching element (20) is controlled by a selection signal supplied to a control line (9) connected with a gate electrode. Each switching element (20) includes a source electrode and the drain electrode each having a comb-like shape having a stem part and branch parts extending therefrom. In at least one switching element (20), only all of or part of the branch parts overlap the control line (9) and a semiconductor layer (10). This suppresses abnormal heat generation of a source driver in a display device including the signal distribution circuit by which an output signal from the source driver is distributed to pixels in time series.

15 Claims, 20 Drawing Sheets

PRIOR ART

SIGNAL DISTRIBUTION DEVICE AND DISPLAY DEVICE

REFERENCE TO RELATED APPLICATIONS

This application is the national stage application under 35 USC 371 of International Application No. PCT/JP2009/066947, filed Sep. 29, 2009, which claims priority on Japanese Patent Application No. 2009-034274, filed Feb. 17, 2009, the entire contents of which are incorporated herein by reference.

TECHNICAL FIELD

The present invention relates to (i) a signal distribution device for time-dividing an input signal into signals and distributing the time-divided signals to a plurality of output terminals and (ii) a display device including the signal distribution device.

BACKGROUND ART

As flat display devices, there have been developed various types of liquid crystal displays (LCDs). Many of them employ an active matrix technique. Along with an increased number of signal lines due to higher resolution of a recent pixel matrix section, a plurality of source drivers are used in many cases.

Such the configuration involves the following problems: (1) A bonding step for attaching the source driver should be carried out an increased number of times, thereby impairing productivity. (2) A pitch between the signal lines is reduced, which is likely to induce defects such as (i) a reduction in a yield rate in the bonding step of the source driver and (ii) corrosion due to a difference in electric potential between terminals. (3) On a display screen of the display device, there appears a boundary between the source drivers due to, e.g., a difference in characteristics between the source drivers or a difference in contact resistance between the terminals.

In order to solve these problems, Patent Literature 1 below discloses a display device which employs a source driver capable of outputting electric signals by terminals whose number is one-third of the number of terminals of a conventional source driver and accordingly eliminates the need for using a plurality of source drivers.

FIG. 16 is a view illustrating an entire configuration of a display device 51. As shown in FIG. 16, the display device 51 includes a pixel matrix section 55 in which pixels are arranged in a matrix of m lines and n columns, a gate driver 53, and a source driver 52 for outputting, as a time-divided driver output signal, a driving signal to each one of red, green, and blue pixels in the pixel matrix section 55. Further, the display device 51 includes a signal distribution device 54 formed monolithically on a TFT substrate. The display device 51 is configured such that the signal distribution device 54 distributes, to signal lines of the pixel matrix section 55, driver output signals outputted by the source driver 52.

FIG. 17 is a view illustrating an internal configuration of the signal distribution device 54. As shown in FIG. 17, the signal distribution device 54 includes (i) distribution lines 57(1,$r$), 57(1,$g$), and 57(1,$b$) through 57($n,r$), 57($n,g$), and 57($n,b$) associated with their corresponding driver output signals Si_1 through Si_n outputted by the source driver 52 (where n is an integer of 2 or greater) and (ii) control lines 59_r, 59_g, and 59_b supplied with switching signals for selecting, among the distribution lines, distribution lines to which the driver output signals Si_1 through Si_n are to be inputted, the distribution lines and the control lines being arranged in a matrix. Note that "r", "g", and "b" denote red, green, and blue, respectively.

The distribution lines 57(1,$r$), 57(1,$g$), and 57(1,$b$) through 57($n,r$), 57($n,g$), and 57($n,b$) have respective output terminals connected with the signal lines of the pixel matrix section 55. Further, the distribution lines are connected with respective TFTs 60(1,$r$), 60(1,$g$), and 60(1,$b$) through 60($n,r$), 60($n,g$), and 60($n,b$), each of which serves as a switching element. The control lines 59_r, 59_g, and 59_b are correspondingly connected with gates of the TFTs 60(1,$r$) through 60($n,r$), 60(1,$g$) through 60($n,g$), and 60(1,$b$) through 60($n,b$).

FIG. 18 is a timing chart of signals for carrying out, in the display device 51, time-division driving of three distribution lines, for example, the distribution lines 57(1,r), 57(1,g), and 57(1,b). As shown in FIG. 18, a driver output signal Si_k, which is outputted from the source driver 52 to a pixel in a kth column out of the n columns (where k is an integer of $1 \leq k \leq n$), is turned to time-division by switching signals of the control lines 59_r, 59_g, and 59_b. Further, signals thus time-divided are inputted to signal lines for red, green, and blue pixels in a jth line out of the m lines (where j is an integer of $1 \leq j \leq m$) which jth line is selected by a scanning signal Vg(j) in the pixel matrix section 55. Note that scanning signals Vg(1) through Vg(m) are signals that the gate driver 12 applies to scanning lines of the pixel matrix section 12.

With this configuration, the source driver 52 can output electric signals by terminals whose number is one-third of the number of terminals of a conventional source driver, and eliminates the need for including a plurality of source drivers.

Patent Literature 2 discloses a shape of a distribution circuit shown in FIG. 19. The distribution circuit disclosed in FIG. 19 includes a switching element 60 having a source electrode and a drain electrode each of which has a comb-like shape. This can substantially increase a channel width. Therefore, this is suitable when an even faster switching speed is required.

CITATION LIST

Patent Literatures

Patent Literature 1
Japanese Patent Application Publication, Tokukai, No. 2004-294858 A (Publication Date: Oct. 21, 2004)
Patent Literature 2
Japanese Patent Application Publication, Tokukaisho, No. 64-084297 A (Publication Date: Mar. 29, 1989)
Patent Literature 3
Japanese Patent Application Publication, Tokukai, No. 2000-029441 A (Publication Date: Jan. 28, 2000)
Patent Literature 4
Japanese Patent Application Publication, Tokukai, No. 2005-055616 A (Publication Date: Mar. 3, 2005)
Patent Literature 5
Japanese Patent Application Publication, Tokukai, No. 2005-107382 A (Publication Date: Apr. 21, 2005)
Patent Literature 6
Japanese Patent Application Publication, Tokukai, No. 2008-097005 A (Publication Date: Apr. 24, 2008)

SUMMARY OF INVENTION

Technical Problem

However, the techniques disclosed in Patent Literatures 1 and 2 give no consideration to a problem of abnormal heat generation of the source driver. Namely, although the techniques disclosed in Patent Literatures 1 and 2 have the merit that the number of output terminals of the source driver can be reduced thanks to use of the distribution circuit, these techniques involve the following problem:

In the case where the distribution circuit is used, a load necessary to drive the source driver is increased to the sum of (i) a load on a source bus line and (ii) a load on the distribution circuit. This is because that an actual distribution circuit includes, as shown in FIG. 20, parasitic capacitances 61, and therefore an additional load corresponding to the parasitic capacitances is given to the source driver.

Note that the parasitic capacitances 61 are generated in (i) regions where the source electrodes of the switching elements 60(k,r), 60(k,g), and 60(k,b) and the control lines 59_r, 59_g, and 59_b overlap each other, (ii) regions where the drain electrodes of the switching elements 60(k,r), 60(k,g), and 60(k,b) and the control lines 59_r, 59_g, and 59_b overlap each other, and (iii) regions where the distribution lines 57(k, r) and 57(k,g) and the control lines 59_g and 59_b overlap each other.

Particularly, in a case where the distribution circuit is made of a device whose mobility (a drift velocity of electric charge per unit electric field and second) is 5 cm²/Vs or less, e.g., microcrystalline silicon, amorphous silicon, or oxide semiconductor, the size of the switching element (TFT) is as enormous as several thousands μm. Therefore, electric charge/discharge occurring due to ON/OFF of the switching element leads to abnormal heat generation of the source driver.

Here, the load given to the source driver is considered with reference to a distribution circuit for dividing a signal into three as shown in FIG. 20. As shown in (a) of FIG. 21, one switching element which is ON has a semiconductor layer in which a channel is being formed, and therefore the semiconductor layer can be regarded as a conductor layer. Accordingly, a parasitic capacitance of the one switching element corresponds to the sum of (i) Cgs1, which is a parasitic capacitance between a source electrode and a gate electrode, and (ii) Cgd1, which is a parasitic capacitance between a drain electrode and the gate electrode.

On the other hand, as shown in (b) of FIG. 21, each of the other two switching elements which are OFF has a semiconductor layer in which no channel is formed, and therefore the semiconductor layer is regarded as an insulative layer. Accordingly, a parasitic capacitance of each of the other two switching elements corresponds only to Cgs2, which is a parasitic capacitance between a source electrode and a gate electrode. From this, the following approximate calculation is possible:

(Load on each output terminal of source driver)=
$Cgs1+Cgd1+2\times Cgs2+$(load on source bus line)     Formula (1)

Note that the above Formula (1) is applied to the case of using the distribution circuit dividing a signal into three. In a case of using a distribution circuit dividing a signal into n, such a formula is expressed as below:

(Load on each output terminal of source driver)=
$Cgs1+Cgd1+(n-1)\times Cgs2+$(load on source bus line)

Thus, according to the conventional techniques, the use of the signal distribution device causes the problem of abnormal heat generation due to an increase in electric power consumption of the source driver.

The present invention was made in order to solve the foregoing problem, and an object of the present invention is to provide a display device which is capable of suppressing abnormal heat generation of a source driver.

Solution to Problem

In order to attain the above object, a signal distribution device of the present invention is a signal distribution device including a plurality of signal distribution circuits, each of the plurality of signal distribution circuits including (i) an input terminal to which an input signal is inputted and (ii) a plurality of distribution lines which are connected with the input terminal and which are connected with a respective plurality of output terminals via switching elements each made of a thin-film transistor, each of the plurality of signal distribution circuits distributing, to the plurality of output terminals via their corresponding switching elements, the input signal inputted to the input terminal, each of the plurality of signal distribution circuits including control lines which are connected with gate electrodes of their corresponding switching elements or which also serve as the gate electrodes, each of the control lines being supplied with a selection signal for driving its corresponding switching element, at least one of the switching elements including an electrode which is connected with the input terminal and which includes a stem part and a plurality of branch parts extending from the stem part, only all of or part of the branch parts overlapping (i) a gate electrode connected with, among the control lines, a control line associated with said at least one switching element or (ii) the control line also serving as the gate electrode and (iii) a semiconductor layer of said at least one switching element.

According to the above configuration, the electrode of the switching element is configured to be branched in such a manner that the plurality of branch parts extend from the stem part. This can substantially increase a channel width. Therefore, the above configuration is applicable to a display device which requires a higher switching speed. On the other hand, increasing the channel width increases a parasitic capacitance of the switching element, thereby leading to the problem of abnormal heat generation caused by increased electric power consumption of the source driver as described previously.

Here, as is also clear from Formula (1), a parasitic capacitance between a source electrode and a gate electrode of each of the plurality of switching elements included in the signal distribution circuit becomes a load on each of the output terminals of the source driver, regardless of whether the switching element is ON or OFF. Therefore, the load on each output terminal of the source driver can be reduced by reducing an area of a region where the source electrode and the gate electrode overlap each other and consequently reducing the parasitic capacitance between the source electrode and the gate electrode. Further, while the switching element is ON, the source electrode and the semiconductor layer of the switching element can be regarded as an integrated conductor layer. Therefore, in order to reduce the parasitic capacitance between the source electrode and the gate electrode, it is better to also reduce an area of a region where the semiconductor layer and the gate electrode overlap each other.

Note that the source electrode corresponds to the electrode connected with the input terminal. Further, the gate electrode, which generates the parasitic capacitance with the source electrode, is connected with the control line. The connection may be made by a configuration of the gate electrode extending from the control line or a configuration of the control line also serving as the gate electrode.

Therefore, by configuring at least one of the switching elements included in the signal distribution circuit such that (i) the gate electrode connected with the control line or the control line also serving as the gate electrode overlaps only the branch parts of the electrode connected with the input terminal and (ii) the semiconductor layer of the at least one switching element overlaps only the branch parts of the electrode connected with the input terminal, it is possible to reduce the parasitic capacitance of the switching element, since this configuration does not allow the stem part, provided in a part of the electrode from which part the branch parts extend, to have no overlapping region.

As described previously about Formula (1), while the switching element is OFF, (i) a parasitic capacitance is considered to be generated between the source electrode and the gate electrode and (ii) a parasitic capacitance is considered not to be generated between the drain electrode and the gate electrode. Therefore, the above configuration of the present invention provides an effect of reducing a parasitic capacitance of the switching element which is OFF. This effect cannot be attained by conventional techniques.

Thus, regardless of whether the switching element is ON or OFF, the above configuration can suppress electric power consumption of the source driver, thereby making it possible to suppress abnormal heat generation.

Note that the configuration "an electrode which is connected with the input terminal and which includes a stem part and a plurality of branch parts extending from the stem part, only all of or part of the branch parts overlapping (i) a gate electrode connected with, among the control lines, a control line associated with the at least one switching element or (ii) the control line also serving as the gate electrode and (iii) a semiconductor layer of the at least one switching element" may be rephrased as "an electrode which is connected with the input terminal and which includes a stem part and a plurality of branch parts extending from the stem part, at least the stem part not overlapping (i) a gate electrode connected with, among the control lines, a control line associated with the at least one switching element, (ii) the control line also serving as the gate electrode, nor (iii) a semiconductor layer of the at least one switching element".

In order to attain the foregoing object, the signal distribution device of the present invention is configured such that: said at least one switching element includes another electrode which is connected with a respective one of the output terminals and which includes a stem part and a plurality of branch parts extending from the stem part, only all of or part of the branch parts overlapping (i) the gate electrode connected with the control line or (ii) the control line also serving as the gate electrode and (iii) the semiconductor layer of said at least one switching element.

With the above configuration, as is also clear from Formula (1), while the switching element is ON, a parasitic capacitance between a drain electrode and a gate electrode of each of the plurality of switching elements included in the signal distribution circuit becomes a load on each of the output terminals of the source driver. Therefore, by configuring at least one of the switching elements included in the signal distribution circuit such that only the branch parts of the drain electrode of the at least one switching element overlap (i) the gate electrode connected with the control line or (ii) the control line also serving as the gate electrode, it is possible to reduce the parasitic capacitance of the switching element, since this configuration does not allow the stem part, provided in a part of the drain electrode from which part the branch parts extend, to have no overlapping region. Note that the drain electrode corresponds to the electrode connected with the output terminal.

This further suppresses electric power consumption of the source driver, thereby further improving the effect of suppressing abnormal heat generation of the source driver.

Note that the configuration "another electrode which is connected with a respective one of the output terminals and which includes a stem part and a plurality of branch parts extending from the stem part, only all of or part of the branch parts overlapping (i) the gate electrode connected with the control line or (ii) the control line also serving as the gate electrode and (iii) the semiconductor layer of the at least one switching element" may be rephrased as "another electrode which is connected with a respective one of the output terminals and which includes a stem part and a plurality of branch parts extending from the stem part, at least the stem part not overlapping (i) the gate electrode connected with the control line, (ii) the control line also serving as the gate electrode, nor (iii) the semiconductor layer of the at least one switching element".

In order to attain the foregoing object, the signal distribution device of the present invention is configured such that: in each of the plurality of signal distribution circuits, each of the switching elements comprises a first switching element and a second switching element which are connected in parallel, each of the first switching element and the second switching element is individually provided with a respective one of the control lines, and said at least one switching element is the first switching element or the second switching element.

According to the above configuration, one switching element is constituted by two parallel-connected switching elements. As a result, it is possible to employ such a configuration that reduces a channel region of each one of the switching elements, thereby reducing the parasitic capacitance. Furthermore, the two switching elements are configured to be individually controlled by different control lines. This makes it possible to employ a control method by which a time difference is provided between timings of turning-off of the respective two switching elements.

Accordingly, with a configuration in which a time difference is provided between timings of turning-off of the respective first and second switching elements each of which is configured to have a reduced parasitic capacitance, it is possible to reduce an amount of drawn electric potential of a source bus line while the first switching element or the second switching element is OFF. This makes it possible to reduce influence given to a display.

Note that, in a case where the at least one switching element is the first switching element, it is possible to obtain a configuration in which (i) the first switching element includes an electrode which is connected with the input terminal and which includes a stem part and a plurality of branch parts extending from the stem part, and (ii) only all of or part of the branch parts overlap the control line and the semiconductor layer of the first switching element.

Further, in a case where the at least one switching element is the first switching element, it is possible to obtain a configuration in which (i) the first switching element includes another electrode which is connected with the output terminal and which includes a stem part and a plurality of branch parts extending from the stem part, and (ii) only all of or part of the branch parts overlap the control line and the semiconductor layer of the first switching element.

Furthermore, in a case where the at least one switching element is the second switching element, it is possible to obtain a configuration in which (i) the second switching element includes an electrode which is connected with the input terminal and which includes a stem part and a plurality of branch parts extending from the stem part, and (ii) only all of or part of the branch parts overlap the control line and the semiconductor layer of the second switching element.

Moreover, in a case where the at least one switching element is the second switching element, it is possible to obtain a configuration in which (i) the second switching element includes another electrode which is connected with the output terminal and which includes a stem part and a plurality of branch parts extending from the stem part, and (ii) only all of or part of the branch parts overlap the control line and the semiconductor layer of the second switching element.

In order to attain the foregoing object, the signal distribution device of the present invention is configured such that: the first switching element and the second switching element shares the electrode connected with the input terminal and the electrode connected with the respective one of the output terminals.

According to the above configuration, the electrodes are shared by the first and second switching elements. This makes it possible to simplify a configuration of each of the electrode connected with the input terminal and the electrode connected with the output terminal. This makes it easier to reduce an area occupied by the entire first switching element and the entire second switching element, thereby enabling to reduce the size of the signal distribution device. This provides an effect of reducing the size of the peripheral region (frame) of the display device.

In order to attain the foregoing object, the signal distribution device of the present invention is configured such that: one of the first switching element and the second switching element has an area smaller than that of the other of the first switching element and the second switching element.

In order to attain the foregoing object, the signal distribution device of the present invention is configured such that: a timing at which one of the first switching element and the second switching element is turned off is later than a timing at which the other of the first switching element and the second switching element is turned off.

For the above configuration, the foregoing has described that, as compared with the case of using the at least one switching element, providing a time difference between timings of turning-off of the respective first and second switching elements each of which is configured to have a reduced parasitic capacitance makes it possible to reduce an amount of drawn electric potential of the source bus line while the first switching element or the second switching element is OFF, thereby enabling to reduce influence given to a display.

In view of the object to attain this effect, the first and second switching elements each of which is configured to have a reduced parasitic capacitance may have areas equal to each other. Further, of the first and second switching elements, a switching element having a relatively larger area may be turned off after a switching element having a relatively smaller area is turned off, or the switching element having a relatively smaller area may be turned off after the switching element having a relatively larger area is turned off. Namely, with any of these configurations, it is possible to attain the above effect, although degrees thereof are different depending on the configurations.

However, with the configuration in which the first switching element and the second switching element are made to have different areas, turning off a switching element having a relatively smaller area after turning off a switching element having a relatively larger area makes it possible to reduce the most an amount of drawn electric potential of the source bus line during OFF, thereby enabling to reduce the most the influence given to a display.

In order to attain the foregoing object, the signal distribution device of the present invention is configured such that: at least one of the control lines has a reduced width or an opening in (i) a region where said at least one of the control lines and a wire extending from the input terminal to the switching elements overlap each other or (ii) a region where said at least one of the control lines and at least one of the distribution lines overlap each other.

According to the above configuration, the control line has a reduced width in the overlapping region. This can reduce an area of the overlapping region. Similarly, the control line has an opening in the overlapping region. Namely, there is no overlapping in the opening, and therefore it is possible to reduce an area of the overlapping region.

This provides an effect of further reducing the parasitic capacitance generated (i) between the distribution line and the control line or (ii) between the control line and the wire extending from the input terminal to the switching elements.

In order to attain the foregoing object, the signal distribution device of the present invention is configured such that: each of the switching elements is a thin-film transistor including a semiconductor layer made of microcrystalline silicon, amorphous silicon, or oxide semiconductor.

In the above configuration, microcrystalline silicon, amorphous silicon, or oxide semiconductor is, as a material of the semiconductor layer of the switching element, a material having relatively small mobility and therefore inevitably requires an increase of an area of the channel. Increasing the area of the channel leads to an increase of the parasitic capacitance of the switching element. This increases electric power consumption of a source driver connected with such the switching element.

Thus, the above configuration can significantly reduce electric power consumption in a case where a switching element having a large size is used in the signal distribution circuit.

A display device of the present invention includes any of the above signal distribution devices.

The display device of the present invention is configured such that: the display device includes a display panel including a display region and a peripheral region, and the signal distribution device is provided in the peripheral region.

According to the above configuration, the display device including the signal distribution device of the present invention can suppress abnormal heat generation of a source driver which supplies a signal to the signal distribution device.

A combination of a feature recited in a focused claim and a feature recited in another claim is not limited to a combination of the feature recited in the focused claim and a feature recited in a claim cited by the focused claim. The feature recited in the focused claim can be combined with a feature recited in any claim even if it is not cited by the focused claim, as long as the object of the present invention can be attained by such the combination.

Advantageous Effects of Invention

As described above, a signal distribution device of the present invention suppresses electric power consumption of a source driver by reducing an area of a region where, among electrodes of a switching element of the signal distribution circuit, at least (i) a source electrode, i.e., an electrode connected with an output terminal of a source driver, and (ii) a gate electrode, i.e., an electrode for controlling the switching element, overlap each other.

Therefore, the present invention provides an effect of suppressing abnormal heat generation of the source driver.

DESCRIPTION OF EMBODIMENTS

Embodiment 1

Figure 1:
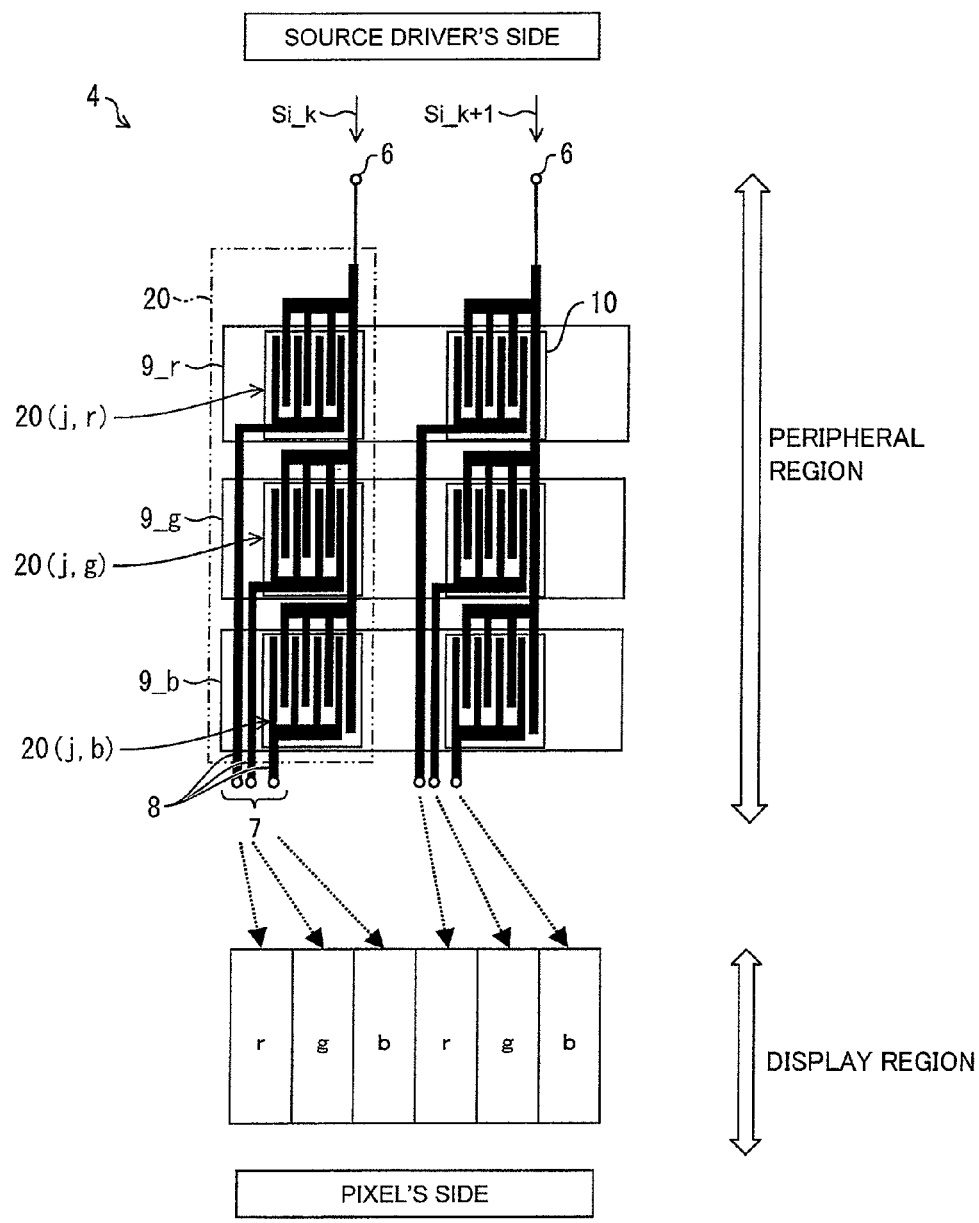
FIG. 1 is an exemplary diagram illustrating one example of a wiring structure of a signal distribution circuit of Embodiment 1 of the present invention, when viewed in a plan view.

The following will describe one embodiment of the present invention with reference to FIG. 1. Note that sizes, materials, shapes, relative positions, etc. of constituent elements described in this embodiment are exemplified merely for explanations, and have no intention to limit the scope of the present invention unless otherwise particularly defined.

Figure 16:
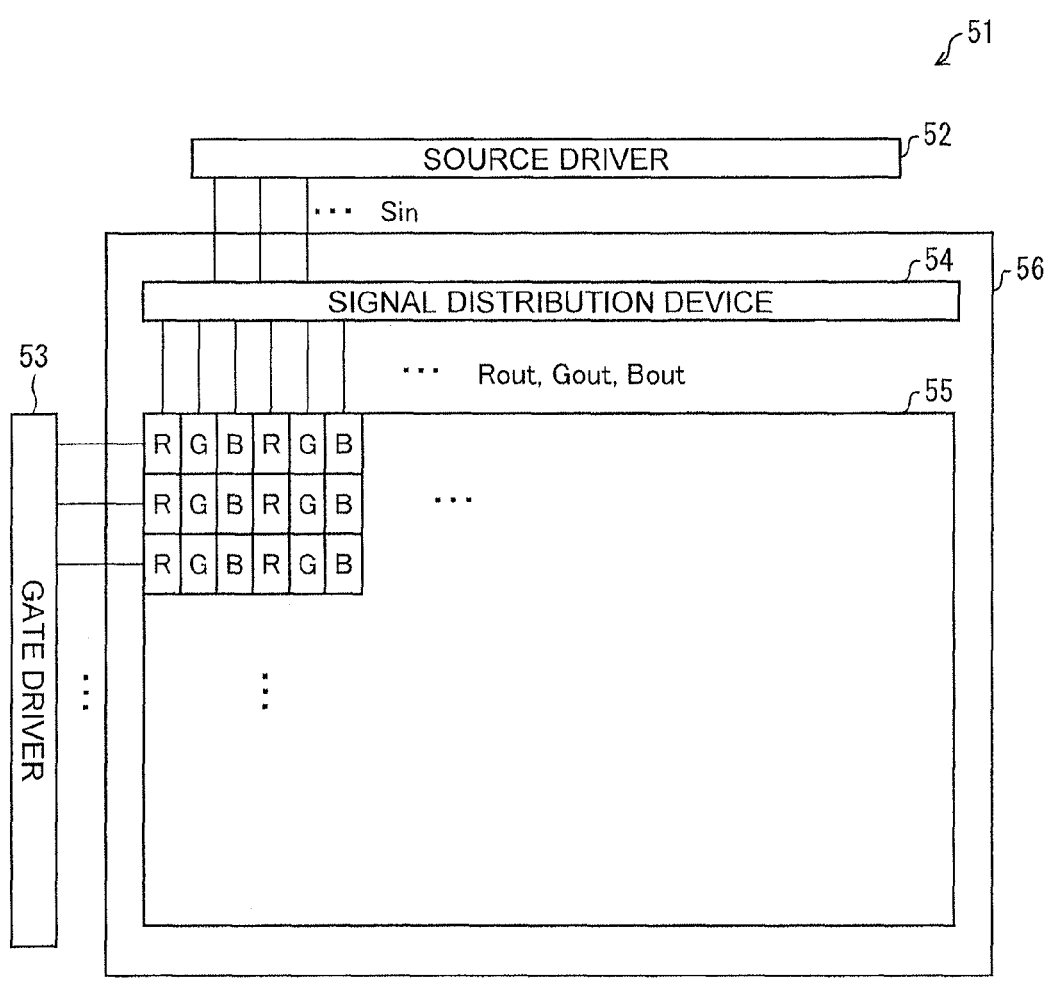
FIG. 16 is a view schematically illustrating a configuration of a generally-used display device.
Figure 17:
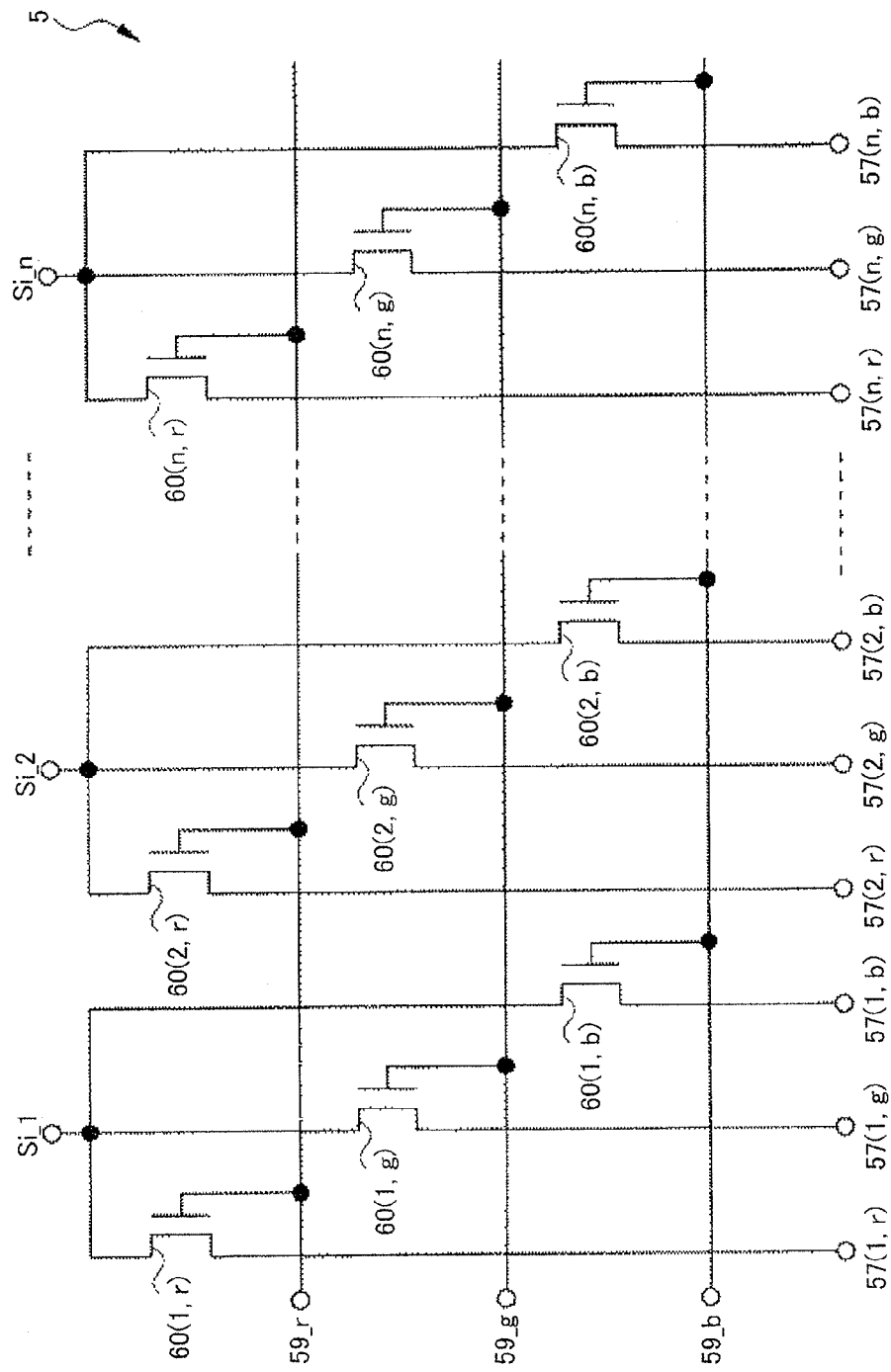
FIG. 17 is a circuit diagram illustrating an internal configuration of a conventional signal distribution circuit.
Figure 18:
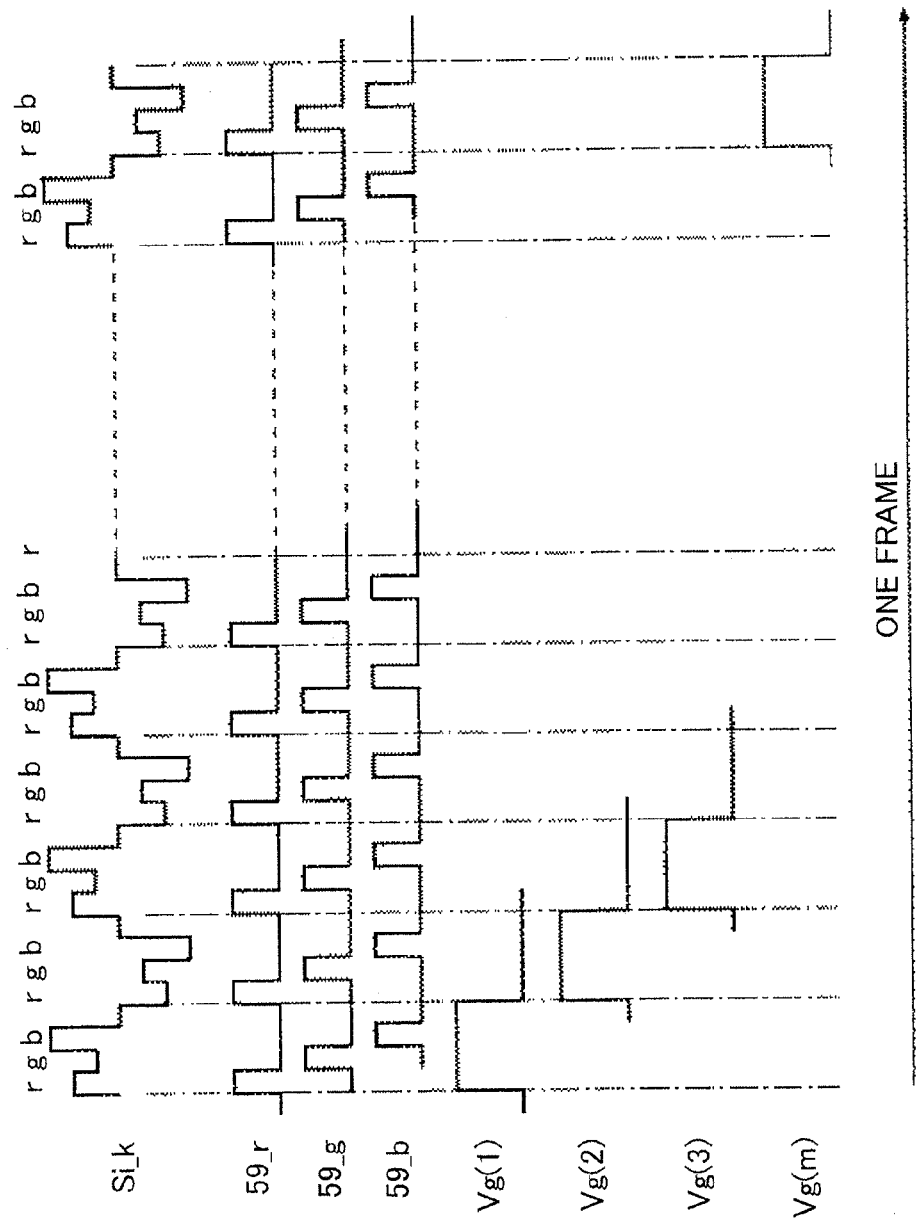
FIG. 18 is a timing chart of the conventional signal distribution circuit.

A display device 51 of the present embodiment is, as shown in FIG. 16, configured to include (i) a display panel 56 including a display region and a peripheral region and (ii) a signal distribution device 54 formed monolithically in the peripheral region. Further, an internal configuration of a signal distribution circuit is as shown in FIG. 17, and a timing chart of the signal distribution circuit is as shown in FIG. 18. Details thereof are as already explained. The following descriptions focus on a wiring structure (a layout of electrodes of switching elements and wires) of the signal distribution circuit.

FIG. 1 is a view illustrating a wiring structure of a signal distribution circuit in a signal distribution device 4 of the present embodiment. An input terminal 6 is supplied with a video signal Si outputted by a source driver (see FIG. 16), and is connected with three distribution lines 8 and three output terminals 7 via switching elements 20.

The input terminal 6 is associated in a one-to-one relationship with one pixel made of a set of three sub-pixels provided with red (r), green (g), and blue (b) color filters. Further, each of the three distribution lines 8 is associated in a one-to-one relationship with a respective one of the three sub-pixels, and each of the three output terminals 7 is also associated in a one-to-one relationship with a respective one of the three sub-pixels.

The switching elements 20 include a switching element 20 $(j,r)$, a switching element 20 $(j,g)$, and a switching element 20 $(j,b)$, which are associated with their respective three sub-pixels. The switching elements 20 permit or interrupt transmission of the video signal Si to the three sub-pixels.

Here, the sign "j" indicates, as shown in FIG. 16, a pixel in a jth line out of pixels arranged in a matrix of m lines and n columns (where j is an integer of $1 \leq j \leq m$). Further, the sign "k" additionally noted to the video signal Si in FIG. 1 indicates a pixel in a kth column out of the pixels arranged in the matrix of m lines and n columns (where k is an integer of $1 \leq k \leq n$).

Note that, for convenience of explanation, each of the switching element 20 $(j,r)$, the switching element 20 $(j,g)$, and the switching element 20 $(j,b)$ is simply called a switching element 20, in cases where it is not necessary to distinguish them from each other.

Each switching element 20 is, more concretely, a thin-film transistor (TFT) having a semiconductor layer 10 made of amorphous silicon, microcrystalline silicon, oxide semiconductor, polycrystalline silicon, or the like.

Each switching element 20 is controlled in such a manner that a selection signal outputted by the source driver passes through one of control lines 9_r, 9_g, and 9_b, and is inputted to the switching element 20 corresponding to the one of the control lines 9_r, 9_g, and 9_b. Note that, for convenience of explanation, each of the control lines 9_r, 9_g, and 9_b is simply called a control line 9, in cases where it is not necessary to distinguish them from each other.

As described above, the signal distribution device 4 of the present embodiment includes a plurality of signal distribution circuits each including (i) one input terminal 6 into which a video signal Si (input signal) is inputted and (ii) a plurality of distribution lines 8 connected with the input terminal 6 and connected with a plurality of output terminals 7 via the switching elements 20 each made of a thin-film transistor. Each of the plurality of signal distribution circuits distributes, to the plurality of output terminals 8 via the switching elements 20, the video signal Si supplied to the input terminal 6.

Next, the following will describe details of a configuration of electrodes of each switching element 20. The electrodes of each switching element 20 include (i) an electrode (hereinafter, referred to as a "source electrode") connected with the input terminal 6 and (ii) an electrode (hereinafter, referred to as a "drain electrode") connected with the output terminal 7. Each of the source electrode and the drain electrode has a comb-like shape having (i) a stem part extending in parallel with the control line 9 and (ii) a plurality of branch parts extending from the stem part along a direction intersecting the control line 9.

FIG. 1 shows an example where the stem part is formed so as to be in parallel with a direction in which the control line 9 extends. However, the present invention is not limited to this pattern. The present invention also encompasses (i) a pattern that a stem part extends at an angle with respect to a direction in which a control line 9 extends and (ii) a pattern that a plurality of branch parts branch from a single portion of a stem part intersecting a control line 9 which single portion does not overlap the control line 9.

By forming each of the source electrode and the drain electrode so as to have the comb-like shape, it is possible to substantially increase a channel width of the switching element 20. This makes it possible to increase a switching speed of the switching element 20.

Currently, in mass production of large liquid crystal panels, a most widely-used semiconductor layer of a TFT is amorphous silicon, whose mobility is as small as $\mu$=0.5 cm$^2$/Vs. Therefore, there is a trend to develop a device with great mobility. Forming the source electrode and the drain electrode to have the comb-like shape provides substantially the same effects as those given by increasing the mobility. Further, for example, the present invention is more effective in increasing an operation speed in a case of using microcrystalline silicon or oxide semiconductor ($\mu$<10 cm$^2$/Vs), each of which is a device having mobility greater than that of amorphous silicon but smaller than that of polysilicon ($\mu$>100 cm$^2$/Vs).

Figure 21:
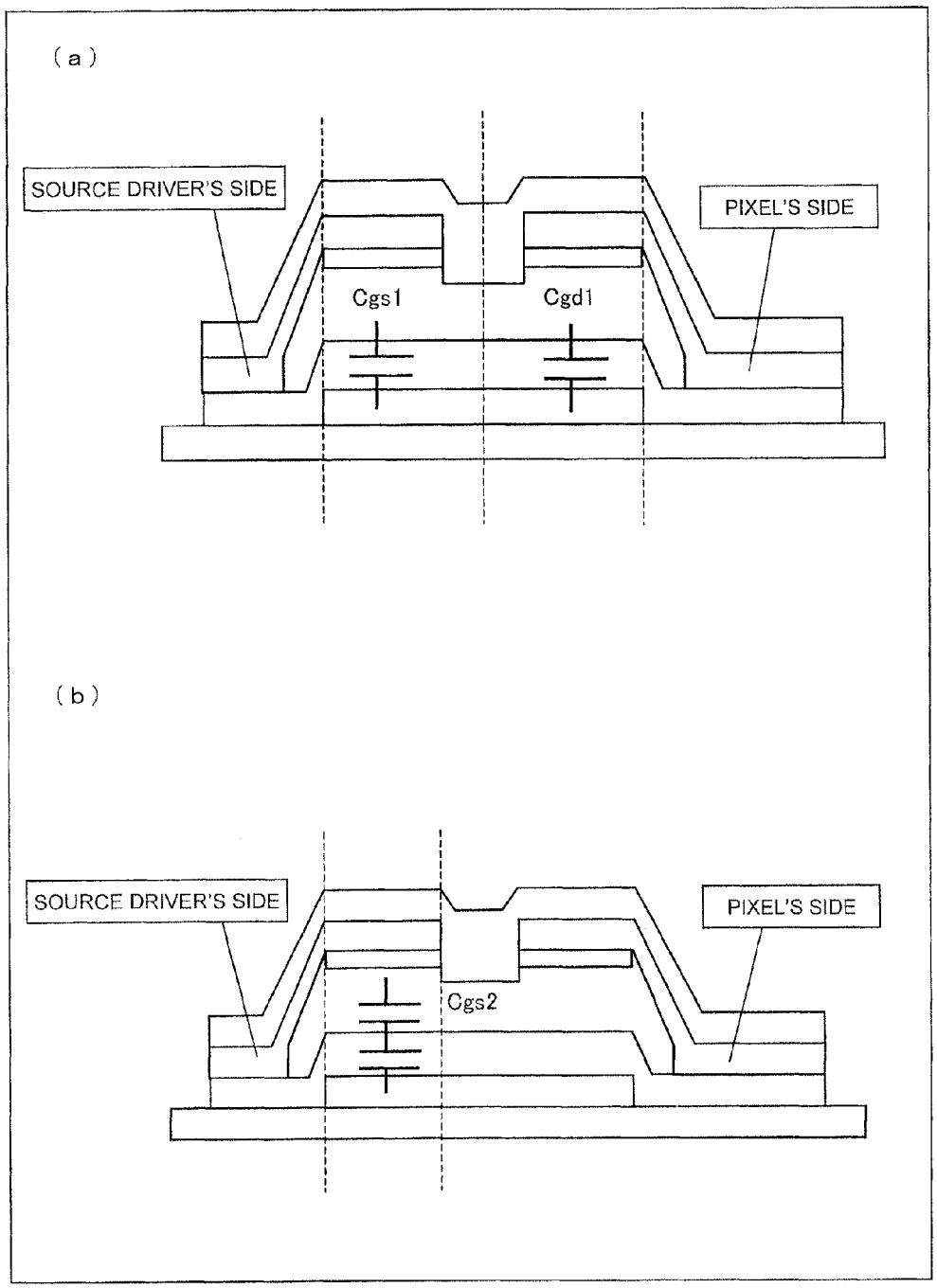
FIG. 21 is cross-section views illustrating switching elements of the signal distribution circuit.

Furthermore, the stem part of the source electrode does not overlap the control line 9 nor the semiconductor layer 10, and only all of or part of the branch parts overlap the control line 9 and the semiconductor layer 10. In other words, at least the stem part of the source electrode does not overlap the control line 9 nor the semiconductor layer 10. (Hereinafter, this is called as Configuration A.) As described previously with reference to FIG. 21, a load on each output terminal of the source driver is expressed by the above-described Formula (1): (Cgs1+Cgd1+2×Cgs2+load on source bus line).

Accordingly, employing Configuration A makes it possible to reduce (i) a parasitic capacitance Cgs1 of one switching element 20 which is ON and (ii) a parasitic capacitance Cgs of each of the other two switching elements which are OFF. This can reduce a load on each output terminal of the source driver. Namely, this can suppress electric power consumption of the source driver, thereby making it possible to suppress abnormal heat generation of the source driver.

Note that each of the parasitic capacitances Cgs1 and Cgs2 is a parasitic capacitance between the source electrode and the gate electrode. Therefore, if at least one switching element 20 out of the switching element 20 (j,r), the switching element 20 (j,g), and the switching element 20 (j,b), which are associated with their respective three sub-pixels, includes a source electrode having Configuration A, this can reduce at least one of loads on the three output terminals of the source driver, regardless of whether the switching element 20 is ON or OFF. Therefore, this can provide the above effects.

Further, as described previously about Formula (1), particularly while the switching element 20 is OFF, (i) the parasitic capacitance Cgs2 is considered to be generated between the source electrode and the gate electrode and (ii) a parasitic capacitance is considered not to be generated between the drain electrode and the gate electrode. Therefore, Configuration A provides an effect of reducing the parasitic capacitance of the switching element 20 which is OFF. This effect cannot be attained by conventional techniques.

FIG. 1 shows the embodiment in which the control line 9 extends immediately below the semiconductor layer of the switching element 20, so as to also serve as the gate electrode. However, the present invention is not limited to this embodiment. Configuration A is also applicable to an embodiment, as shown in FIG. 17, in which a control line 59 does not extend immediately below a semiconductor layer of a switching element 60 and a gate electrode extends from the control line 59.

However, in such a case, Configuration A is rephrased as "the stem of the source electrode does not overlap (i) the gate electrode extending from the control line 9 nor (ii) the semiconductor layer 10, and only all of or part of the branch parts overlap the gate electrode and the semiconductor layer 10".

Here, according to the above-described embodiment, the video signal Si outputted by the source driver is divided by the signal distribution circuit into three in terms of time, so as to be supplied to the source bus line. However, the present invention is not limited to the one dividing a signal into three, and only needs to be the one dividing a signal into n (n is a natural number of 2 or greater). In a case of the one dividing a signal into n, the number of output terminals of the source driver can be reduced to one-nth of the number of output terminals of a source driver provided in a configuration not using a signal distribution device 4. Note that, in the case of the one dividing a signal into n, the signal distribution device 4 is configured to include n control lines 9, and each signal distribution circuit is configured to include n switching elements 20.

Figure 2:
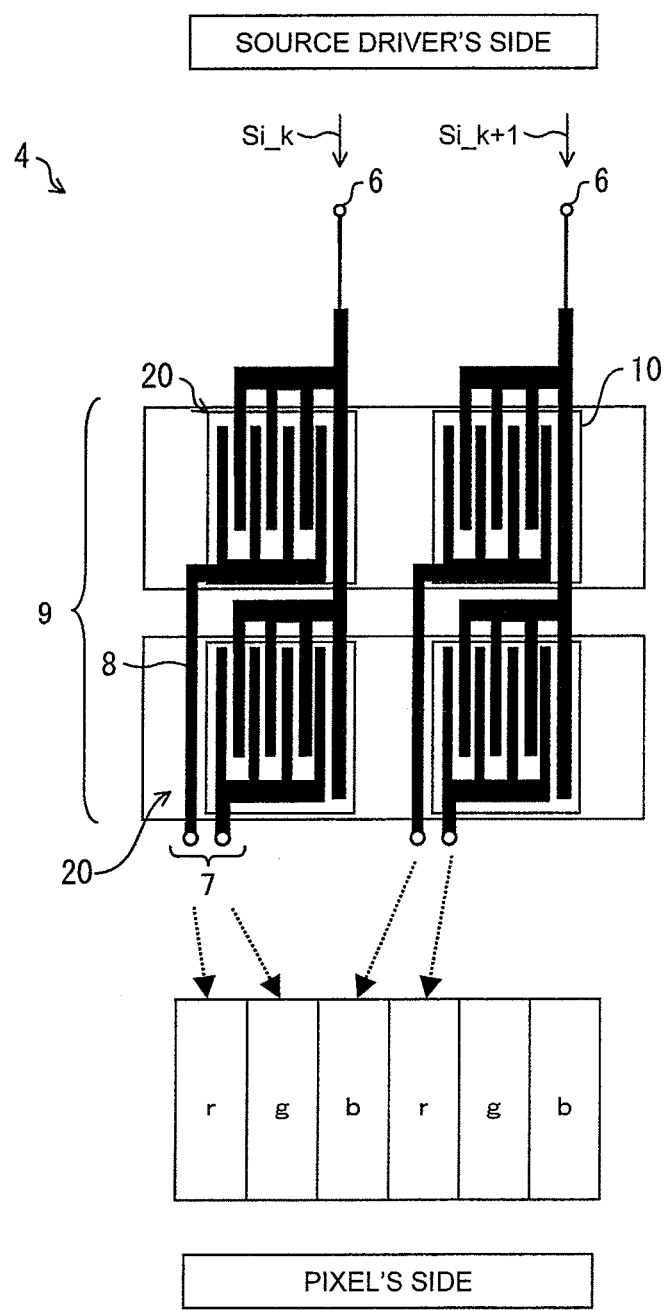
FIG. 2 is an exemplary diagram illustrating another example of the wiring structure of the signal distribution circuit of Embodiment 1 of the present invention, when viewed in a plan view.

FIG. 2 exemplifies a wiring structure of a signal distribution circuit 4 dividing a signal into two. In the embodiment shown in FIG. 2, a video signal Si is time-divided and supplied to two sub-pixels adjacent to each other, which constitutes one set.

Figure 3:
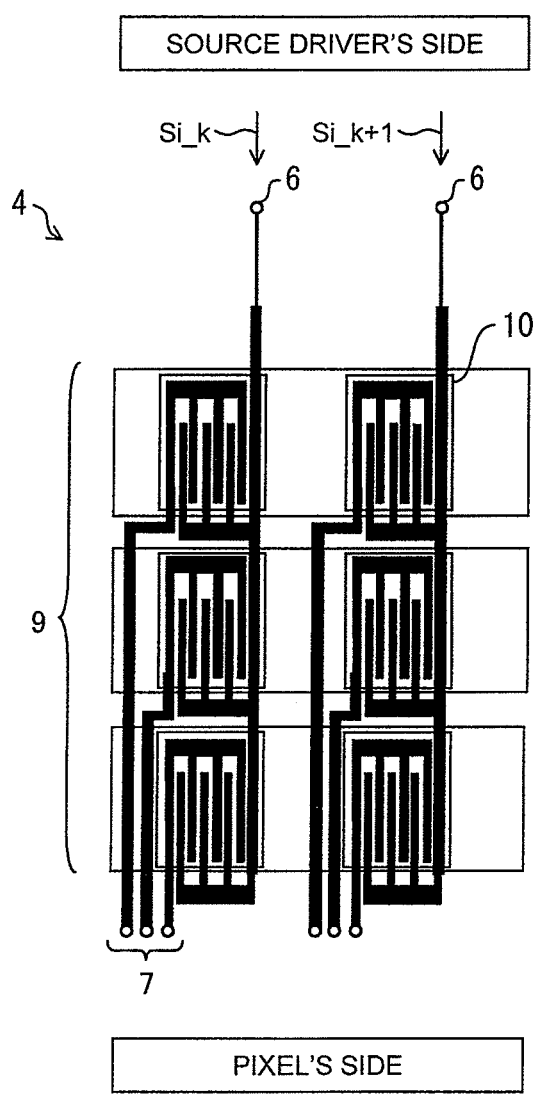
FIG. 3 is an exemplary diagram illustrating further another example of the wiring structure of the signal distribution circuit of Embodiment 1 of the present invention, when viewed in a plan view.

A switching element 20 is not limited to a configuration in which, as shown in FIG. 1, a stem part of a source electrode is positioned on the source driver's side when viewed from its respective control line 9. Alternatively, as shown in FIG. 3, a source electrode may be positioned so as to be opposite to that in FIG. 1, namely, a stem part of the source electrode may be positioned on the pixel's side when viewed from its respective control line 9. This configuration can also provide the same effects as those given by the configuration of FIG. 1.

Figure 4:
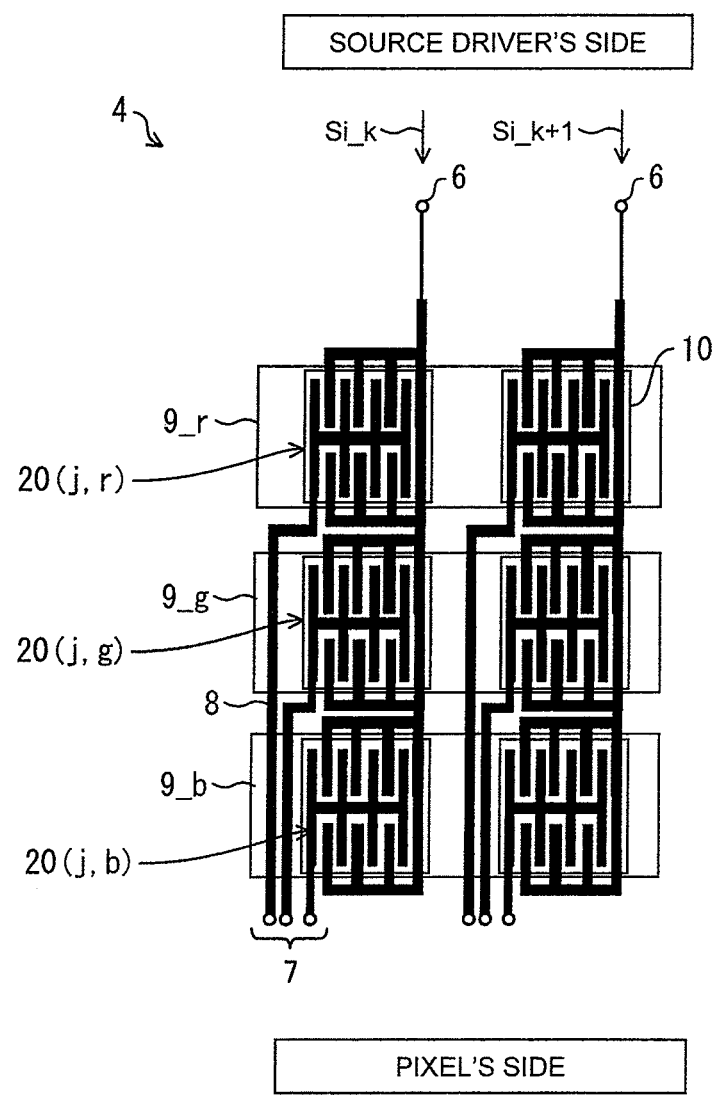
FIG. 4 is an exemplary diagram illustrating still further another example of the wiring structure of the signal distribution circuit of Embodiment 1 of the present invention, when viewed in a plan view.

Further alternatively, as shown in FIG. 4, a switching element 20 may include (i) a drain electrode including (a) a stem part positioned in a center part of its respective control line 9

(in other words, along a center line extending in a direction along which the control line 9 extends) and (b) branch parts, some of which extend from the stem part toward the source driver's side and the other of which extend from the stem part toward the pixel's side so that the branch parts form a fishbone shape, and (ii) a source electrode including (a) two stem parts, one of which is provided on the source driver's side when viewed from the control line 9 and the other of which is provided on the pixel's side when viewed from the control line 9, and (b) branch parts, some of which extends from the one stem part toward the center part of the control line 9 and the other of which extends from the other stem part toward the center part of the control line 9, only all of or part of the branch parts of the source electrode overlapping the control line 9 and the semiconductor layer 10. Employing this configuration can substantially further increase a channel width, thereby making it possible to further increase a switching speed of the switching element 20.

Note that, as shown in FIG. 1, aligning the switching elements 20 (j,r), 20(j,g), and 20(j,b) along a direction orthogonal to a direction in which the control line 9 extends can minimize an area occupied by the signal distribution circuit 4 in the direction in which the control line 9 extends.

Embodiment 2

Figure 5:
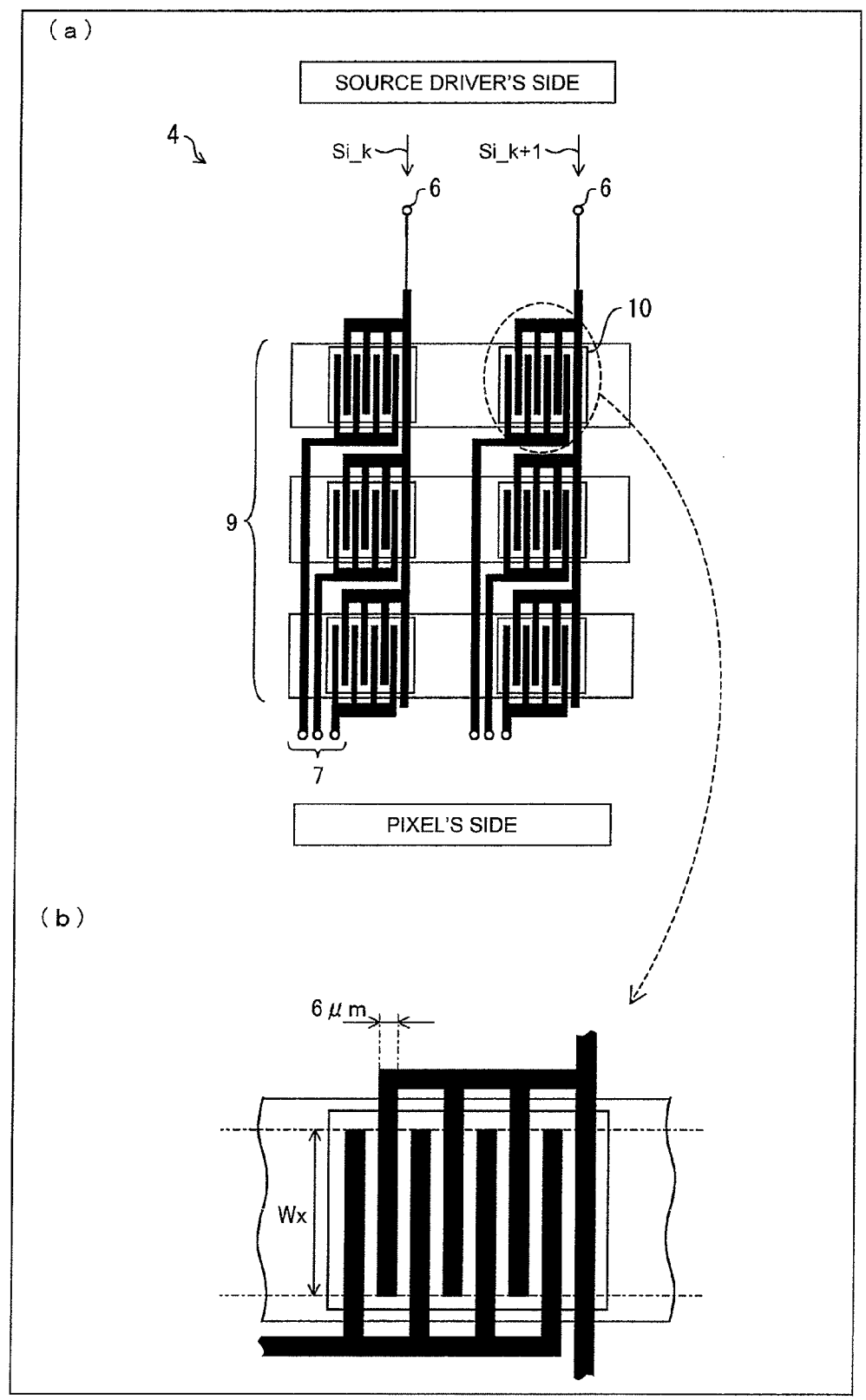
FIG. 5 is an exemplary diagram illustrating one example of a wiring structure of a signal distribution circuit of Embodiment 2 of the present invention, when viewed in a plan view.

With reference to FIG. 5, the following will describe Embodiment 2. FIG. 5 is a view illustrating a wiring structure of a signal distribution circuit in a signal distribution device 4 of the present embodiment. The present embodiment differs from Embodiment 1 in terms of an internal configuration of a distribution circuit. In order to avoid redundancy in explanation, the following descriptions will focus on the differences. For convenience of explanation, members having the same functions as those explained in drawings of Embodiment 1 are given the same signs as Embodiment 1 and explanations thereof are omitted here.

Embodiment 2 includes, in addition to the configuration of the source electrode described in Embodiment 1, such a configuration in which a stem part of a drain electrode (corresponding to another electrode of the switching element) does not overlap a control line 9 nor a semiconductor layer 10, and only all of or part of branch parts overlap the control line 9 and the semiconductor layer 10. In other words, at least the stem part of the drain electrode does not overlap the control line 9 nor the semiconductor layer 10. (Hereinafter, this is called as Configuration B.)

As described previously, a load on each output terminal of a source driver is expressed by "Cgs1+Cgd1+2×Cgs2+load on source bus line". Therefore, employing Configuration B makes it possible to reduce Cgd1, which is a parasitic capacitance between a drain electrode and a gate electrode of a switching element 20 which is ON. This can reduce a load on the output terminal. Namely, this can further suppress electric power consumption of the source driver, thereby making it possible to further suppress abnormal heat generation of the source driver.

Figure 6:
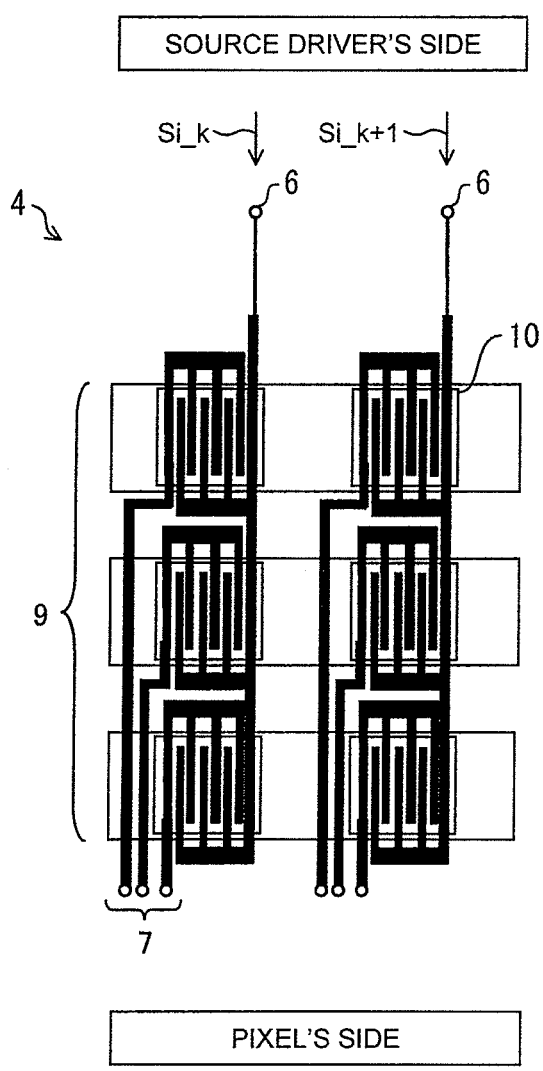
FIG. 6 is an exemplary diagram illustrating another example of the wiring structure of the signal distribution circuit of Embodiment 2 of the present invention, when viewed in a plan view.

Further, the switching element 20 is not limited to the configuration of FIG. 5 in which (i) the stem part of the source electrode is positioned on the source driver's side when viewed from its respective control line 9 and (ii) the stem part of the drain electrode is positioned on the pixel's side when viewed from the control line 9. Alternatively, as shown in FIG. 6, a source electrode and a drain electrode may be positioned so as to be opposite to those in FIG. 5, namely, a stem part of a source electrode may be positioned on the pixel's side when viewed from its respective control line 9 and a stem part of a drain electrode may be positioned on the source driver's side when viewed from the control line 9. This configuration can also provide the same effects as those given by the configuration of FIG. 5.

Figure 7:
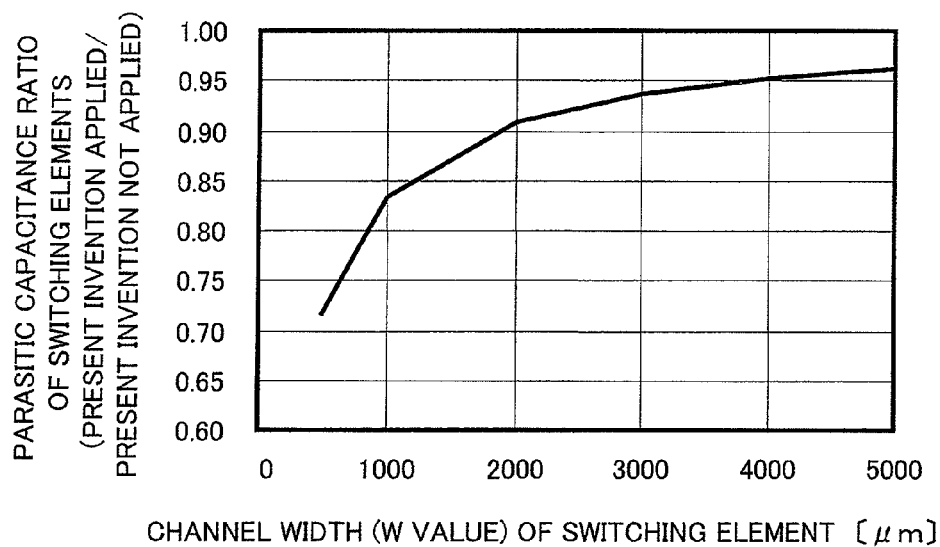
FIG. 7 is a graph showing a relationship between (i) a ratio of (a) electric power consumption of a source driver in a case of employing the present invention and (b) that in a case of not employing the present invention and (ii) a size of a switching element.
Figure 19:
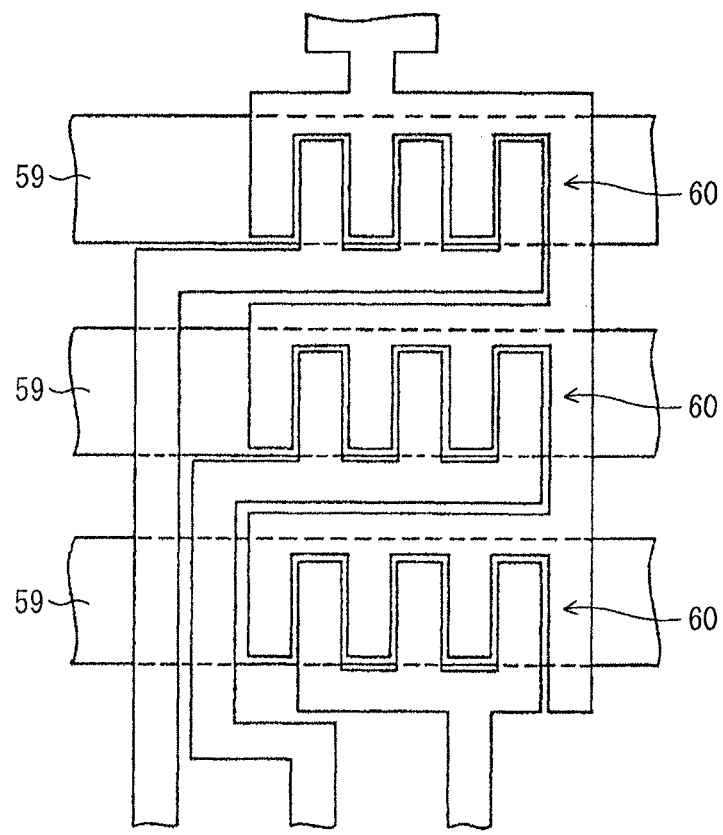
FIG. 19 is a plan view illustrating a wiring structure of the conventional signal distribution circuit.
Figure 20:
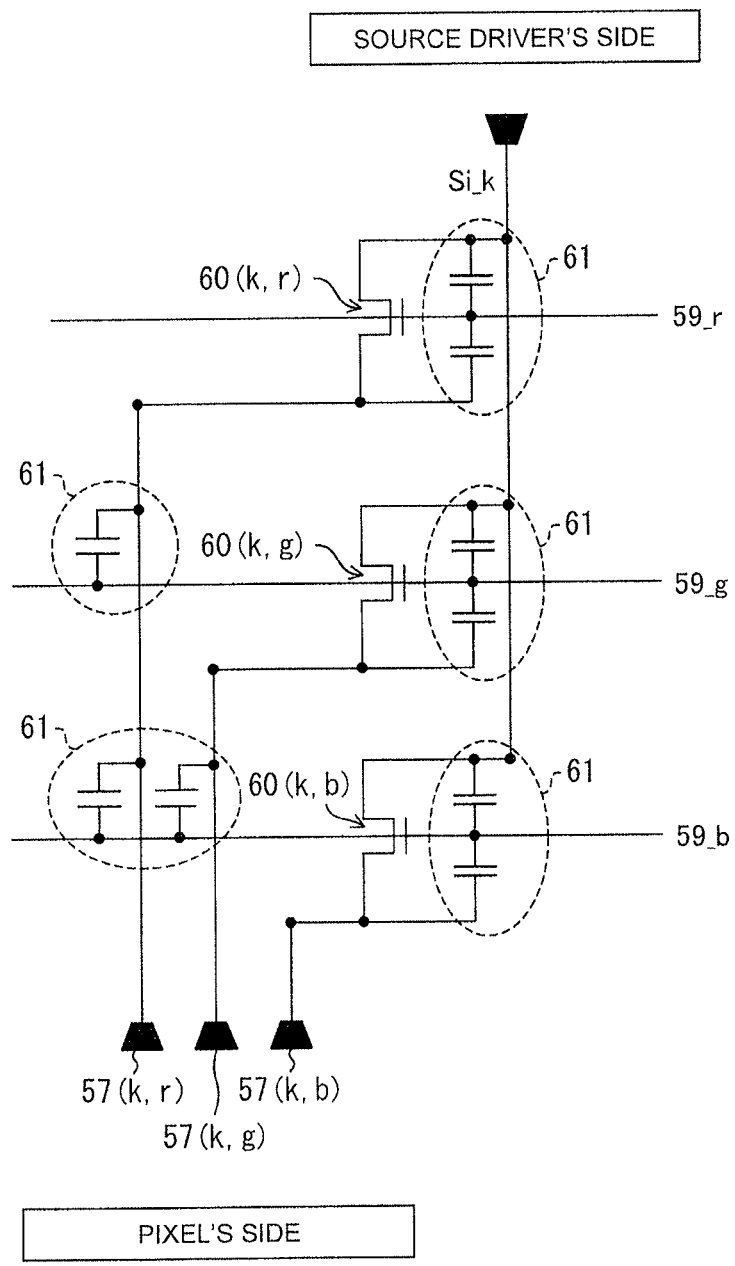
FIG. 20 is a circuit diagram illustrating an internal configuration of a generally-used signal distribution circuit.

FIG. 7 is a graph, related to a switching element 20 including a semiconductor layer 10 made of microcrystalline silicon and a source electrode having a width of 6 μm as shown in (b) of FIG. 5, showing a relationship between (i) a ratio (parasitic capacitance ratio) of a parasitic capacitance in a wiring structure of the present invention and a parasitic capacitance in a conventional wiring structure and (ii) a channel width (W value) of the switching element 20. Used as the wiring structure of the present invention was the wiring structure of the signal distribution circuit of the present embodiment shown in FIG. 5 or 6. Meanwhile, used as the conventional wiring structure was the wiring structure in which, as shown in FIG. 19, the stem part of the source electrode overlaps the control line 9 and the semiconductor layer 10.

The channel width (W value) is found by multiplying (i) a basic channel width $W_x$, corresponding to a width of a part where the source electrode and the drain electrode being adjacent to each other face each other as shown in (b) of FIG. 5, and (ii) m, which indicates the number of parts where the source electrode and the drain electrode face each other. In the example shown in (b) of FIG. 5, m=7. Accordingly, the channel width (W value)=$W_x$×7.

The smaller the parasitic capacitance ratio is, the smaller the parasitic capacitance in the wiring structure of the present invention is. With respect to each of all the channel widths shown in FIG. 7, the parasitic capacitance ratio is smaller than 1. This shows that the wiring structure of the present invention can reduce a parasitic capacitance and a load on a source driver as compared with the conventional wiring structure.

Furthermore, as is clear from FIG. 7, in the case of using the microcrystalline silicon TFT, of the switching elements having the channel widths increased in units of 1000 μm, a switching element having a relatively smaller channel width provides a greater effect (i.e., a smaller parasitic capacitance ratio) by employing the present embodiment.

Thus, in the current trend to reduce electric power consumption, the present invention is particularly effective in a case where a switching element is made of a device, e.g., a microcrystalline silicon TFT, whose mobility is several times greater than that of a currently-used amorphous silicon TFT. It is highly possible that the device having several times greater mobility is applied to a large, high-resolution liquid crystal display television. Therefore, it is effective to apply the present invention to the large, high-resolution liquid crystal display television.

Figure 8:
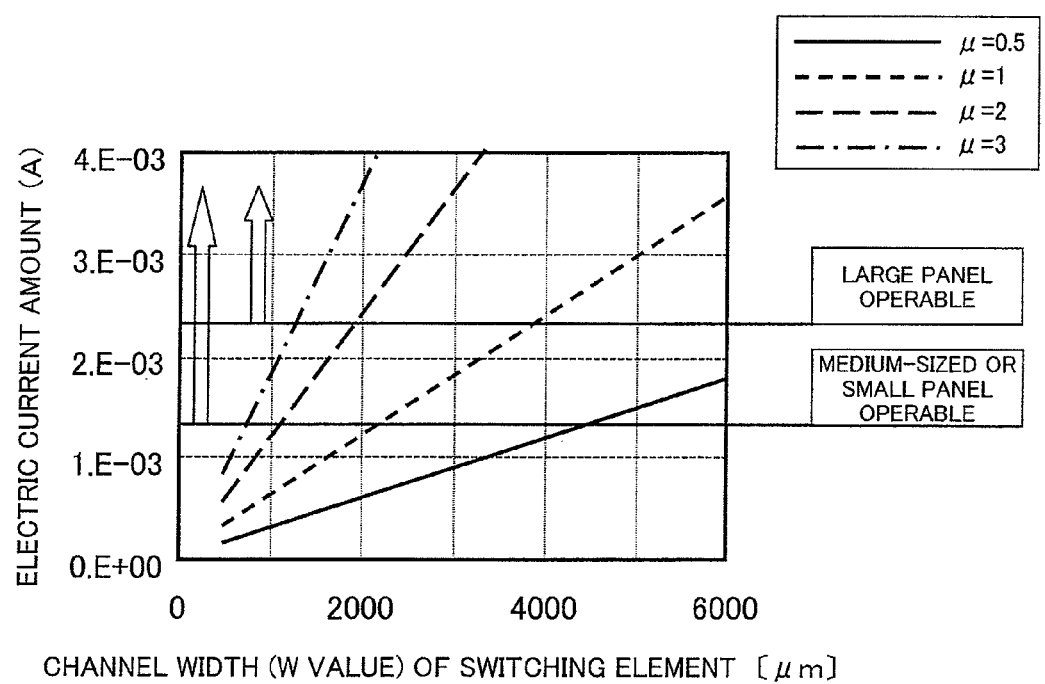
FIG. 8 is a graph showing a relationship between (i) an operating condition of a display panel and (ii) mobility of a switching element.

FIG. 8 is a graph showing a relationship between (i) an amount of electric current necessary to operate a liquid crystal panel and (ii) a channel width (W value) of a switching element 20, which relationship was observed in cases of using four types of switching elements 20 having mobility μ of 0.5 cm$^2$/Vs, 1.0 cm$^2$/Vs, 2.0 cm$^2$/Vs, and 3.0 cm$^2$/Vs. The "large panel" in FIG. 8 means, e.g., a liquid crystal panel of 32 inch or larger, and the "medium-sized or small panel" means, e.g., a liquid crystal panel of 7 inch or larger.

Note that the amount of electric current shown in FIG. 8 is merely a rough indication, and a main purpose thereof is to indicate a relative magnitude relation. Also note that "0.E+00" indicates 0×10$^0$, i.e., 0, whereas "1.E-03" indicates 1×10$^{-3}$.

As is clear from FIG. 8, as a switching element having greater mobility is developed, a channel width necessary to operate a liquid crystal panel can be made smaller. Therefore, the result of FIG. 7 shows that the present invention is more effective in a configuration using a switching element having greater mobility.

Embodiment 3

With reference to FIGS. 9 through 12, the following will describe Embodiment 3. For convenience of explanation, members having the same functions as those explained in drawings of Embodiment 1 are given the same signs as Embodiment 1 and explanations thereof are omitted here.

Figure 9:
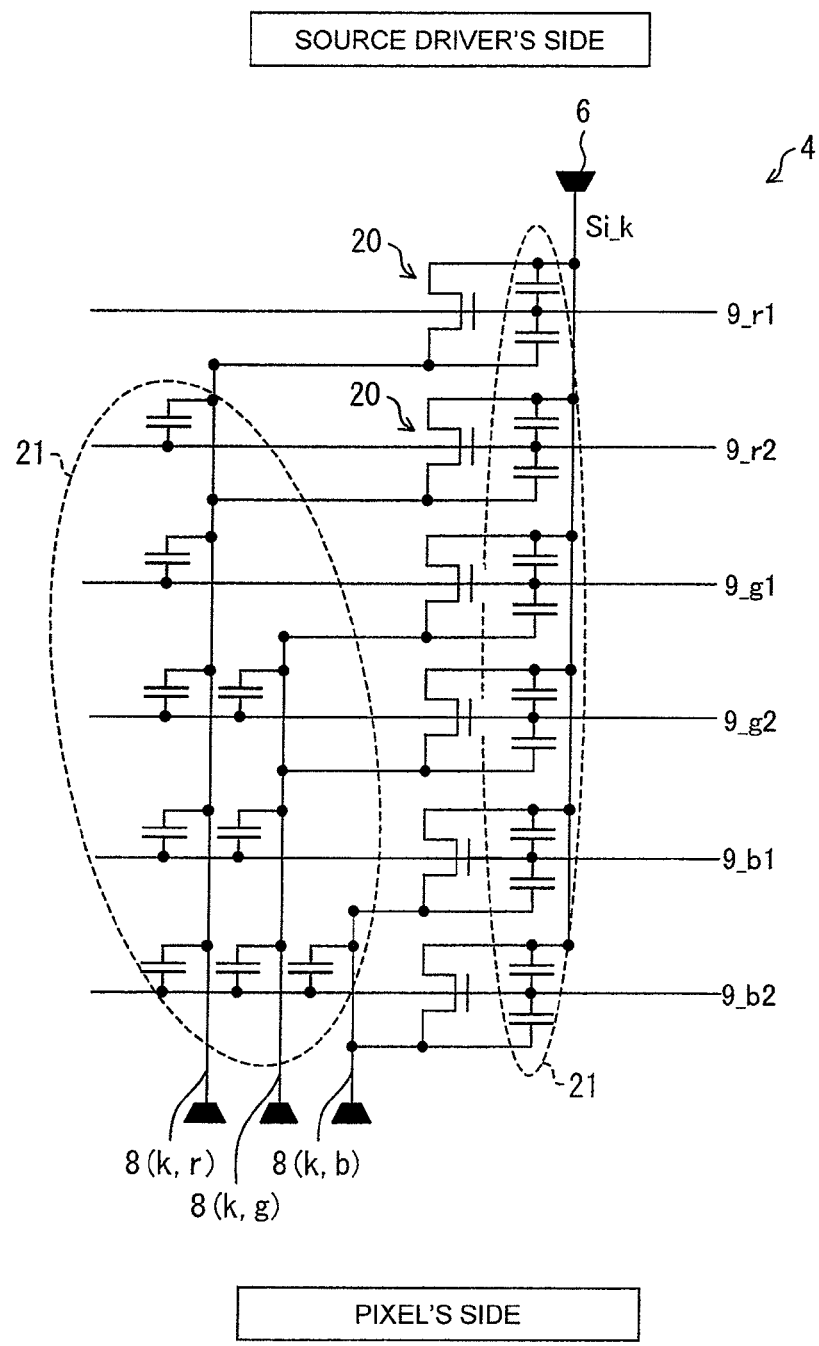
FIG. 9 is an equivalent circuit diagram illustrating an internal configuration of a signal distribution circuit of Embodiment 3 of the present invention.

FIG. 9 is an equivalent circuit diagram illustrating an internal configuration of a signal distribution circuit in a signal distribution device 4. As shown in FIG. 9, the signal distribution circuit includes distribution lines 8(k,r), 8(k,g), and 8(k,b) and control lines 9_r1, 9_r2, 9_g1, 9_g2, 9_b1, and 9_b2, the distribution lines and the control lines being arranged in a matrix. The distribution lines 8(k,r), 8(k,g), and 8(k,b) deal with a driver output signal Si_k outputted from a source driver to a pixel in a kth column (where k is an integer of 1≤k≤n), and are associated with three sub-pixels of red (r), green (g), and blue (b). Further, the control lines 9_r1, 9_r2, 9_g1, 9_g2, 9_b1, and 9_b2 are supplied with switching signals for selecting one of the distribution lines 8(k,r), 8(k,g), and 8(k,b) to which the driver output signal Si_k is to be inputted.

Note that, in the following descriptions, each of the distribution lines 8(k,r), 8(k,g), and 8(k,b) is simply called a distribution line 8, in cases where it is not necessary to distinguish them from each other; and each of the control lines 9_r1, 9_r2, 9_g1, 9_g2, 9_b1, and 9_b2 is called a control line 9, in cases where it is not necessary to distinguish them from each other.

An output terminal of each distribution line 8 is connected with a signal line in a pixel matrix section. Further, between an input terminal 6 and each distribution line 8 of the signal distribution circuit into which the driver output signal Si_k is inputted, two parallel-connected TFTs, each serving as a switching element 20, are connected. Namely, two switching elements 20 are provided for each distribution line 8. Each control line 9 is connected with a gate electrode of its respective switching element 20.

Thus, the control lines 9 are individually provided for the respective two parallel-connected switching elements 20, which are provided for one sub-pixel. This makes it possible to individually control ON/OFF of the two switching elements 20.

The signal distribution circuit has parasitic capacitances 21 shown in FIG. 9. The parasitic capacitances 21 are generated in (i) regions where source electrodes of the TFTs 20 and the control lines 9 overlap each other, (ii) regions where drain electrodes of the TFTs 20 and the control lines 9 overlap each other, and (iii) regions where the distribution lines 8 and the control lines 9 overlap each other.

Figure 10:
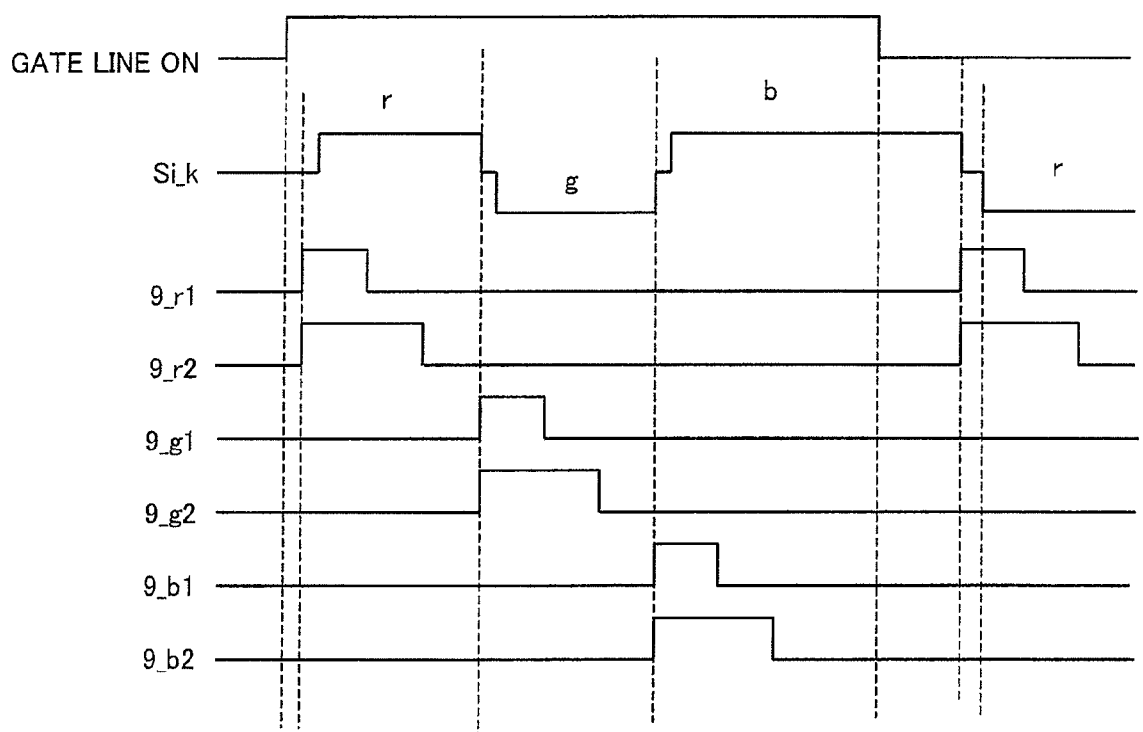
FIG. 10 is a timing chart of the signal distribution circuit of Embodiment 3 of the present invention.

FIG. 10 is a timing chart of signals in the distribution circuit shown in FIG. 9. As shown in FIG. 10, a driver output signal Si_k (where k is an integer of 1≤k≤n) outputted from the source driver is turned to time-division by sequentially turning on/off the TFTs 20 by switching signals to the control lines 9_r1, 9_r2, 9_g1, 9_g2, 9_b1, and 9_b2. Further, signals thus time-divided are sequentially allocated to signal lines associated with three sub-pixels constituting a respective pixel in the pixel matrix section.

Note that a gate line ON signal selects a jth pixel line (j is an integer of 1≤j≤m) to which the driver output signal Si_k is supplied. The timing chart of FIG. 10 exemplifies a case of dot inversion driving carried out in units of sub-pixel.

In the present embodiment, two parallel-connected switching elements 20 are connected with one distribution line 8. As shown in FIG. 10, a switching element (hereinafter, referred to as a second switching element) connected with a control line 9_m2 is turned off after a switching element (hereinafter, referred to as a first switching element) connected with a control line 9_m1 (where m is one of r, g, and b) is turned off.

Figure 11:
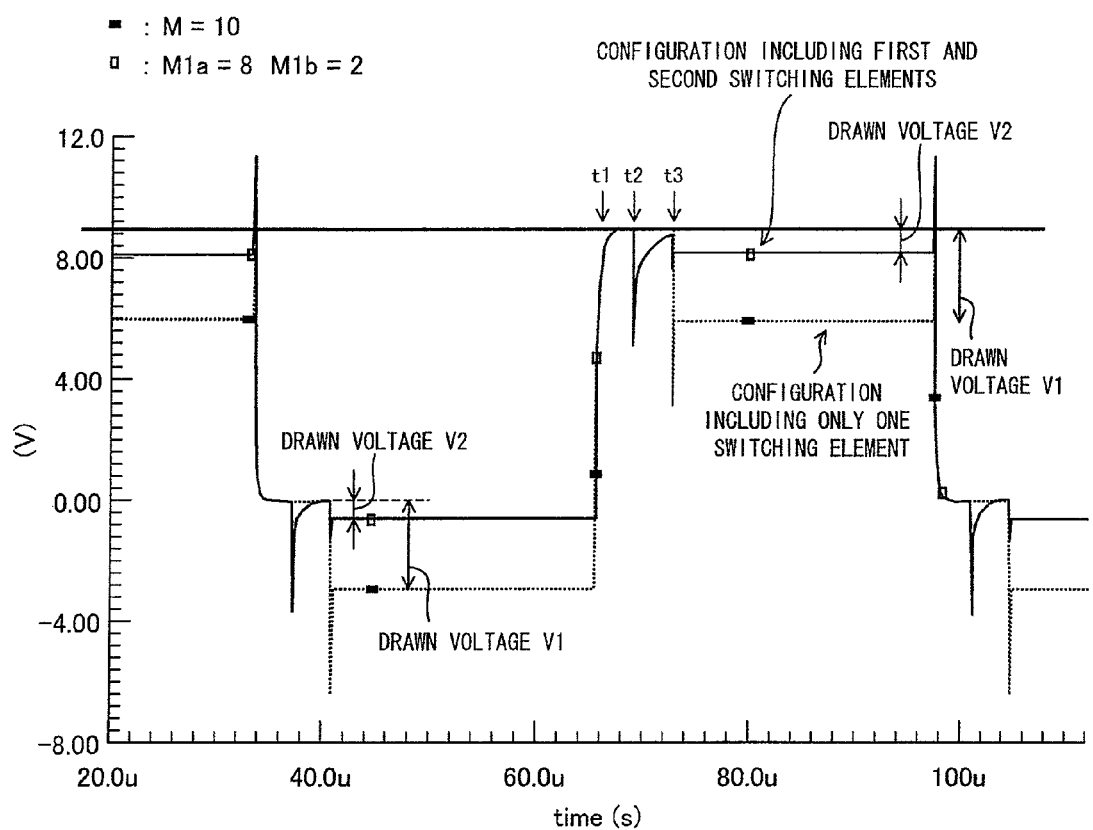
FIG. 11 is a graph showing a result of an experiment regarding a drawn electric potential of a source bus line of the signal distribution circuit of Embodiment 3 of the present invention.

FIG. 11 shows a temporal change in an electric potential of the source bus line which change is caused by ON/OFF of the switching elements, where an area M of the switching element (called a reference switching element) of Embodiment 1 or 2 is 10, an area M1a of the first switching element is 8, and an area M1b of the second switching element is 2.

Note that the area of the switching element refers to an area (channel length×channel width) of a channel region of the switching element. The above ratio, 10:8:2, is an area ratio of the channel regions. However, if the channel lengths of the respective switching elements are hardly different from each other, the above ratio (10:8:2) is almost equal to a ratio of the channel widths of the respective switching elements.

The following describes the change in the electric potential of the source bus line shown in FIG. 11. For example, if the reference switching element is turned on at time t1 and turned off at time t3, an amount of drawn electric potential of the source bus line becomes a drawn voltage V1 in response to the turning-off. Meanwhile, if the first and second switching elements are turned on at time t1 and the first switching element is turned off at time t2 (t1<t2), the electric potential of the source bus line is once drawn by a similar amount to the drawn voltage V1; however, since the second switching element is maintaining its ON state, the electric potential is quickly recovered. Subsequently, if the second switching element is turned off at time t3 (t2<t3), an amount of final drawn electric potential of the source bus line caused by the turning-off becomes a drawn voltage V2 (V2<V1).

Namely, as compared with a configuration using only one switching element, the above configuration can reduce, from V1 to V2, the drawn voltage of the electric potential of the source bus line caused by turning-off of the switching element.

Thus, by (i) setting the size of the first switching element to be smaller than that of the reference switching element (in the configuration using only one switching element for each sub-pixel, the reference switching element corresponds to the one switching element) and (ii) also setting the size of the second switching element to be smaller than that of the reference switching element, it is possible to reduce a parasitic capacitance involving drawing of the electric potential of the source bus line.

In order that an amount of drawn electric potential of the source bus line in a case of using the first and second switching elements is smaller than that in a case of using the reference switching element, each of the sizes of the first and second switching elements may be set to be smaller than that of the reference switching element. Therefore, the sizes of the first and second switching elements may be set to be equal to each other.

Also with a configuration in which the sizes of the first and second switching elements are set to be different from each other, it is possible to obtain the effect of reducing the amount of drawn electric potential of the source bus line, provided that each of the sizes of the first and second switching elements is smaller than that of the reference switching element. This is true for any of (i) a case where a switching element having a relatively larger area is turned off after a switching element having a relatively smaller area is turned off and (ii) a case where the switching element having a relatively smaller area is turned off after the switching element having a relatively larger area is turned off.

However, with the configuration as shown in FIG. 11 in which (i) the size of the second switching element is set to be smaller than that of the first switching element and (ii) the second switching element, which has a relatively smaller size, is turned off after the first switching element is turned off, it is possible to further reduce the amount of drawn electric potential of the source bus line.

Reducing the drawn voltage can reduce influence given to a display. Furthermore, the above configuration can stagger timings at which the switching elements are turned on. More specifically, the above configuration can reduce an ON-period of the first switching element which is turned off prior to the second switching element, thereby making it possible to elongate life of at least the first switching element.

Further, setting the size of the first switching element, which is turned off before the second switching element is turned off, to be larger than that of the second switching element, which is turned off after the first switching element is turned off, is desirable also in terms of that (i) this can sufficiently output a video signal to the source bus line and (ii) this can reduce the drawn voltage of the electric potential of the source bus line caused by turning-off of the switching element.

As in the present embodiment, the above configuration allows the source driver to output an electric signal by terminals whose number is one-third of the number of terminals of a conventional source driver, thereby eliminating the need for using a plurality of source drivers. Further, with the configuration in which (i) two parallel-connected switching elements are connected with one distribution line and (ii) these switching elements are individually controlled, it is possible to reduce a drawn voltage of a video signal and to elongate life of the switching element.

Furthermore, by adding, to the above configuration of the present embodiment, the wiring structure of the signal distribution circuit described in Embodiment 1 or 2, it is possible to additionally provide (i) the effect of reducing electric power consumption of the source driver and (ii) the effect of suppressing abnormal heat generation. The following will describe the wiring structure of the signal distribution circuit.

Figure 12:
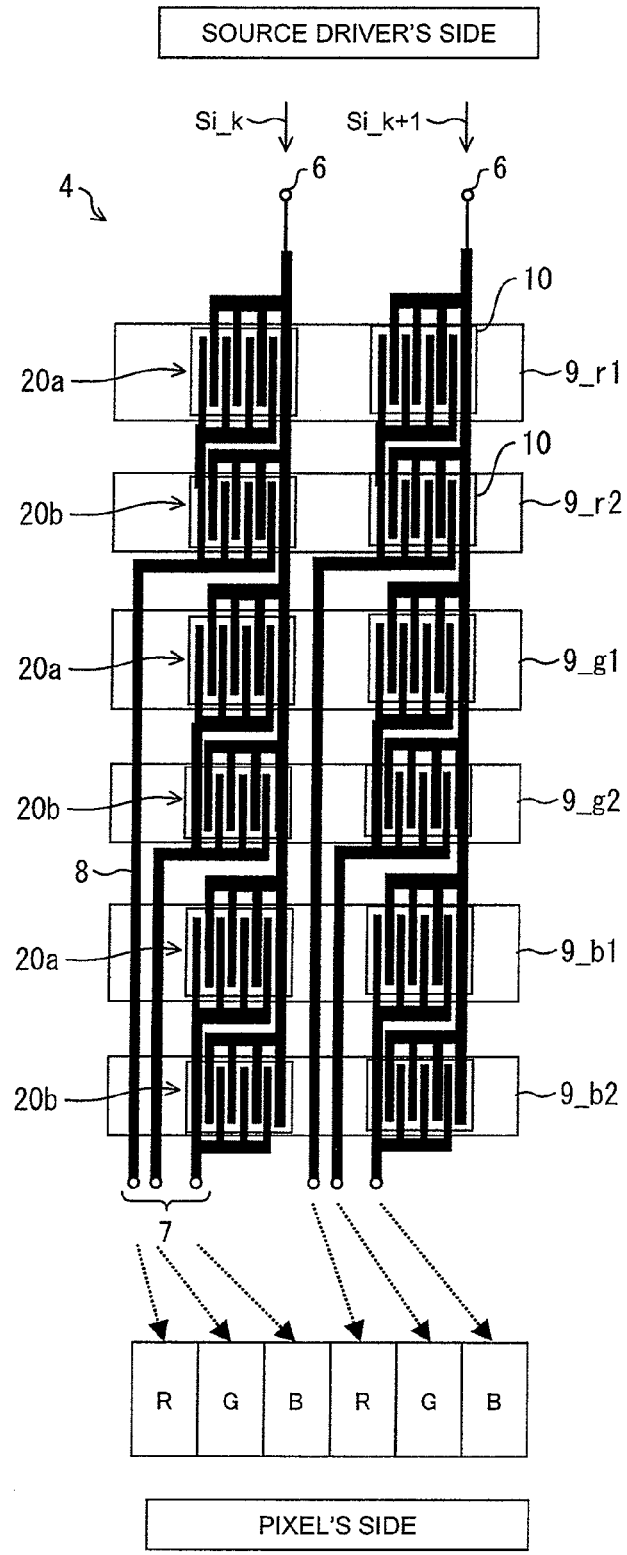
FIG. 12 is an exemplary diagram illustrating one example of a wiring structure of the signal distribution circuit of Embodiment 3 of the present invention, when viewed in a plan view.

FIG. 12 is a view illustrating a wiring structure of a signal distribution circuit in a signal distribution device 4 of the present embodiment. An input terminal 6 into which a video signal Si is inputted by the source driver is connected with three distribution lines 8 and three output terminals 7 via two parallel-connected switching elements 20*a* and 20*b* (first switching element and second switching element). Each of the switching elements 20*a* and 20*b* is a thin-film transistor (TFT) including a semiconductor layer made of amorphous silicon, microcrystalline silicon, oxide semiconductor, polycrystalline silicon, or the like.

The switching elements 20*a* and 20*b* provided for three sub-pixels are each controlled in such a manner that a selection signal outputted by the source driver passes through one of control lines 9_r1, 9_r2, 9_g2, 9_b1, and 9_b2, and is inputted to the switching element 20*a* or 20*b*. Note that each of the control lines 9_r1, 9_r2, 9_g1, 9_g2, 9_b1, and 9_b2 is hereinafter simply called a control line 9, in cases where it is not necessary to distinguish them from each other.

Each of the switching elements 20*a* and 20*b* includes a source electrode and a drain electrode each having a comb-like shape. This can substantially increase a channel width, thereby making it possible to increase a switching speed of each of the switching elements 20*a* and 20*b*.

Further, stem parts of the source electrodes and the drain electrodes of the switching elements 20*a* and 20*b* do not overlap the control line 9 nor the semiconductor layer 10, and only branch parts thereof overlap the control line 9 and the semiconductor layer 10.

As described previously, a load on each output terminal of the source driver is expressed by "Cgs1+Cgd1+2×Cgs2+load on source bus line". Therefore, employing the above configuration makes it possible to reduce Cgs1, Cgs2, and Cgd1, thereby reducing a load on the output terminal. Namely, this can suppress electric power consumption of the source driver, thereby making it possible to suppress abnormal heat generation of the source driver.

The wiring structure shown in FIG. 12 is configured such that the stem parts of the source electrodes and the drain electrodes of all the switching elements in the distribution circuit do not overlap the control lines nor the semiconductor layers, and only the branch pats thereof overlap the control lines and the semiconductor layers. However, if such a configuration is employed in which (i) merely the stem part of the source electrode of at least one first switching element or second switching element does not overlap the control line nor the semiconductor layer and (ii) only all of or part of the branch parts thereof overlap the control line and the semiconductor layer, it is possible to suppress electric power consumption of the source driver, thereby suppressing abnormal heat generation of the source driver.

Further, with regard to a position of the switching element, the present invention is not limited to the configuration in which the stem part of the source electrode is positioned on the source driver's side when viewed from its respective control line. Alternatively, with a configuration in which the source electrode is positioned so as to be opposite to that of FIG. 12, i.e., a configuration (not illustrated) in which the stem part of the source electrode is positioned on the pixel's side when viewed from the control line as well as in the configuration shown in FIG. 3, it is possible to provide the same effects as those given by the configuration of FIG. 12.

Figure 13:
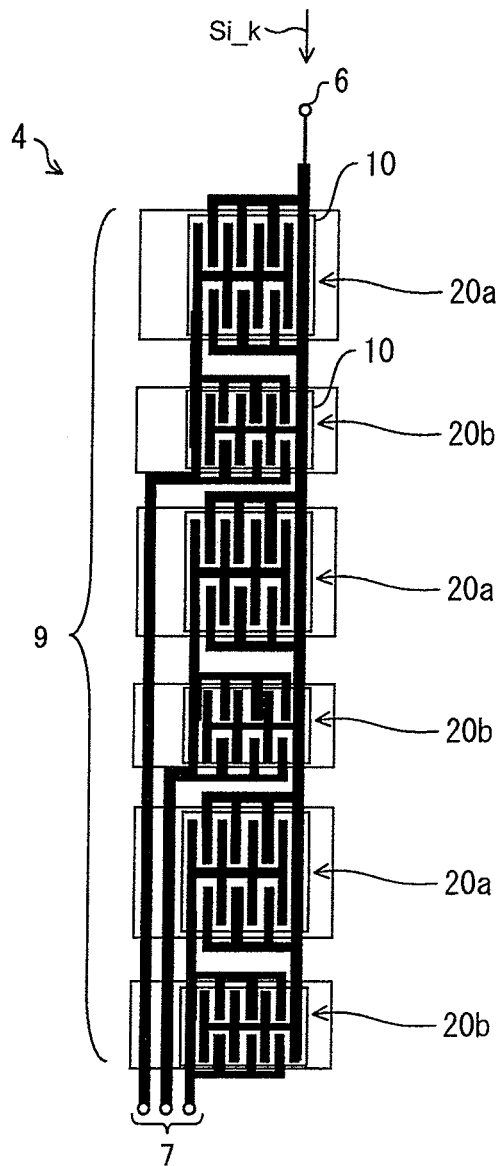
FIG. 13 is an exemplary diagram illustrating another example of the wiring structure of the signal distribution circuit of Embodiment 3 of the present invention, when viewed in a plan view.

Further alternatively, as shown in FIG. 13, each of the switching elements 20*a* and 20*b* may include (i) a drain electrode having (a) a stem part positioned in a center part of its respective control line 9 and (b) branch parts, some of which extend from the stem part toward the source driver's side and the other of which extend from the stem part toward the pixel's side so that the branch parts form a fishbone shape, and (ii) a source electrode having (a) two stem parts, one of which is provided on the source driver's side when viewed from the control line 9 and the other of which is provided on the pixel's side when viewed from the control line 9, and (b) branch parts, some of which extends from the one stem part toward the center part of the control line 9 and the other of which extends from the other stem part toward the center part of the control line 9, only the branch parts of the source electrode overlapping the control line 9 and the semiconductor layer 10. Employing this configuration can substantially further increase a channel width, thereby making it possible to further increase a switching speed of each of the switching elements 20*a* and 20*b*.

Figure 14:
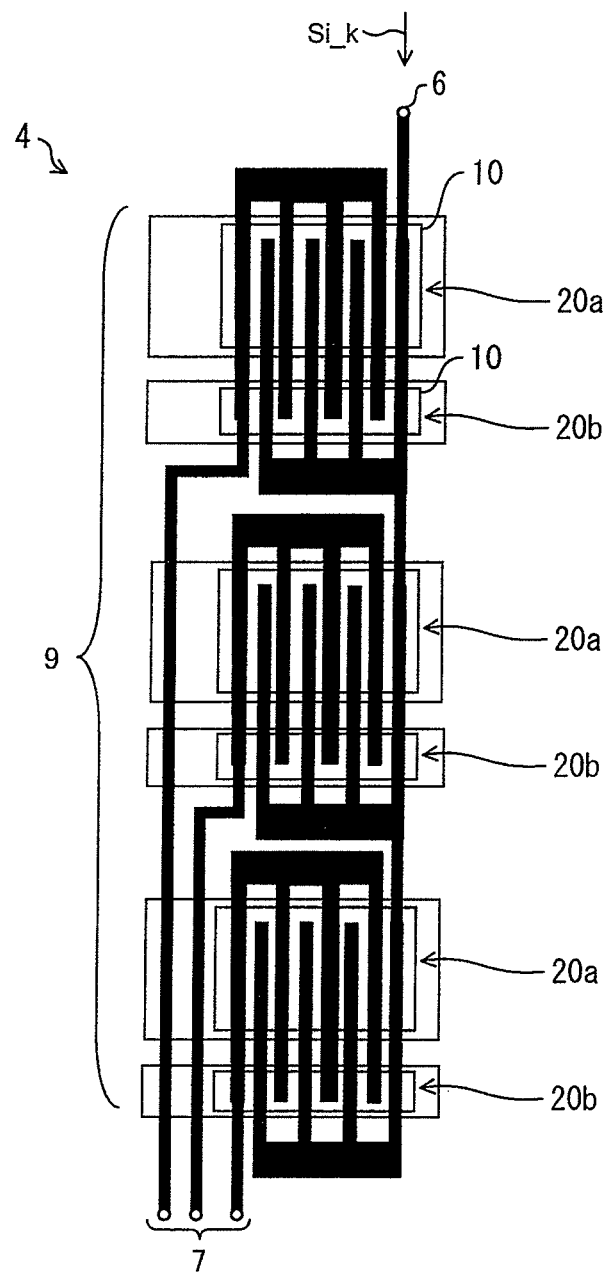
FIG. 14 is an exemplary diagram illustrating further another example of the wiring structure of the signal distribution circuit of Embodiment 3 of the present invention, when viewed in a plan view.

Still further alternatively, as shown in FIG. 14, the switching elements 20*a* and 20*b* may be configured such that (i) a first switching element 20*a* and a second switching element 20*b* shares a source electrode and a drain electrode and (ii) control lines 9 are individually provided for the first switching element 20*a* and the second switching element 20*b*. This configuration can also provide the same effects as those given by the configuration of FIG. 12 or 13. Namely, according to this configuration, the source electrode includes branch parts extending, in a direction intersecting the control line 9, from one stem part extending along a direction in which the control line 9 extends. Further, the branch parts go through a part above the semiconductor layer 10 of one of the switching elements 20a and 20b, and reach a part above the semiconductor layer 10 of the other one of the switching elements 20a and 20b. The drain electrode has the same configuration as that of the source electrode.

As compared with the configurations of FIGS. 12 and 13, this configuration can reduce the size of the distribution circuit in the direction intersecting the control line 9. Therefore, this configuration is advantageous in reducing a width of a frame of the display device. Further, according to this configuration, the source electrode and the drain electrode are shared by the switching elements; therefore, as compared with the configurations of FIGS. 12 and 13, this configuration can simplify the configuration of the source electrode and the drain electrode.

Other Embodiments

Figure 15:
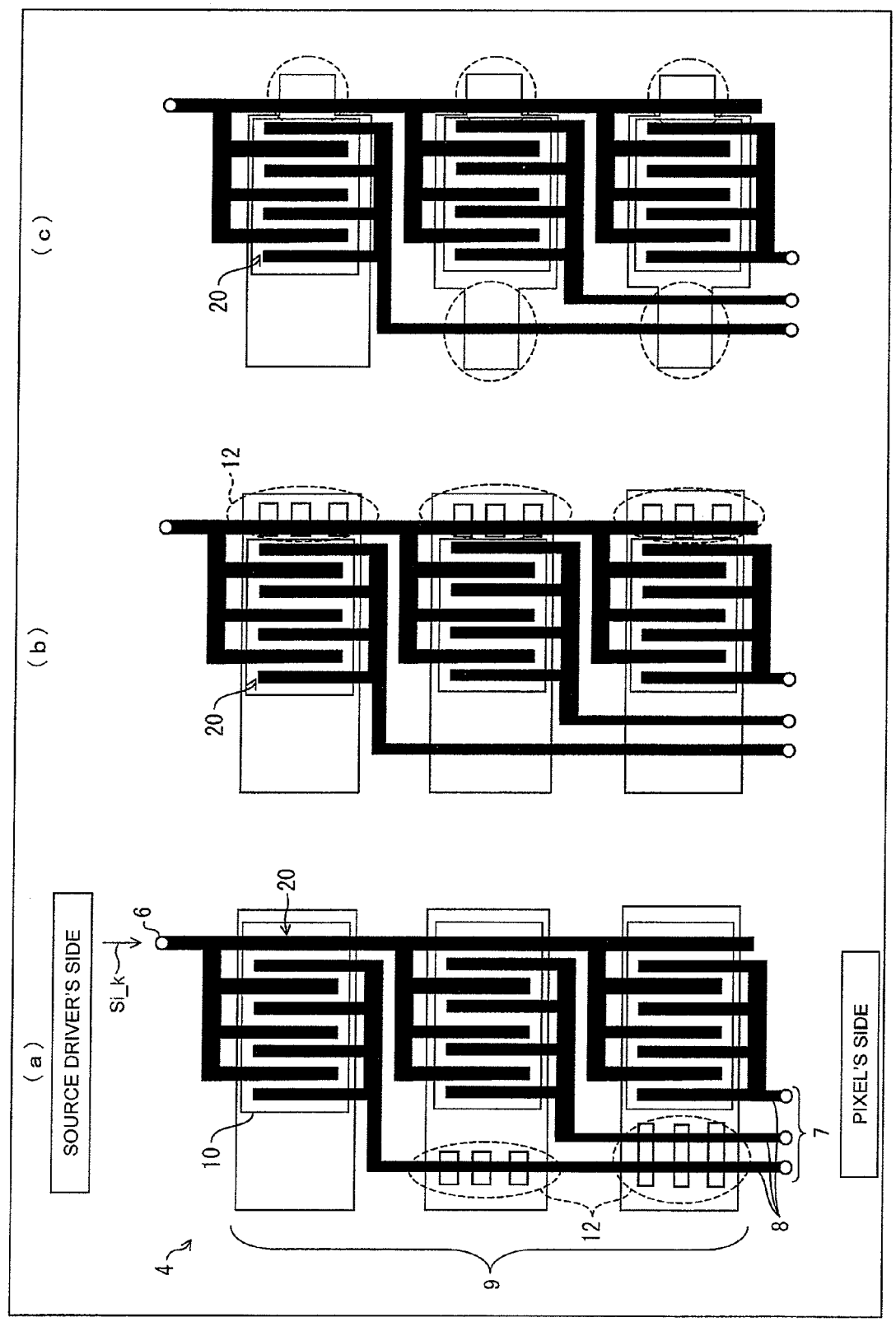
FIG. 15 is an exemplary diagram illustrating one example of wiring structures of signal distribution circuits of other Embodiments of the present invention, when viewed in a plan view.

Each distribution circuit may be configured such that a control line 9 is provided with an opening 12 in (i) a region where, as shown in (a) of FIG. 15, the control line 9 and a distribution line 8 overlap each other or (ii) a region where, as shown in (b) of FIG. 15, the control line 9 and a wire extending from an input terminal 6 to source electrodes of switching elements 20 overlap each other.

This configuration can reduce an area of (i) the region where the control line 9 and the distribution line 8 overlap each other or (ii) the region where the control line 9 and the wire extending to the source electrodes overlap each other, thereby reducing a parasitic capacitance. As a result, it is possible to further reduce a load on an output terminal of a source driver, thereby making it possible to further suppress electric power consumption of the source driver.

Alternatively, as shown in (c) of FIG. 15, a control line 9 may have a reduced width in (i) a region where the control line 9 and a distribution line 8 overlap each other or (ii) a region where the control line 9 and a wire extending from an input terminal 6 to source electrodes of switching elements 20 overlap each other. This configuration can also provide the same effects.

Note that the opening 12 of (a) of FIG. 15, the opening 12 of (b) of FIG. 15, and the control line 9 of (c) of FIG. 15 may be arbitrarily combined.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applicable to a signal distribution device for time-dividing an output signal from a former circuit so as to supply the time-divided signals to a following circuit via a plurality of distribution lines. Thus, the present invention is applicable to electric devices such as a display device including such the signal distribution device.

REFERENCE SIGNS LIST

4 Signal distribution device
6 Input terminal
7 Output terminal
8 Distribution line
9 Control line
10 Semiconductor layer
12 Opening
20 Switching element
20a Switching element (first switching element)
20b Switching element (second switching element)
21 Parasitic capacitance
51 Display device
52 Source driver
55 Pixel matrix section
56 Display panel
Si Video signal (input signal)

The invention claimed is:

1. A signal distribution device comprising a plurality of signal distribution circuits,
   each of the plurality of signal distribution circuits including (i) an input terminal to which an input signal is inputted and (ii) a plurality of distribution lines which are connected with the input terminal and which are connected with a respective plurality of output terminals via switching elements each made of a thin-film transistor,
   each of the plurality of signal distribution circuits distributing, to the plurality of output terminals via their corresponding switching elements, the input signal inputted to the input terminal,
   each of the plurality of signal distribution circuits including control lines which are connected with gate electrodes of their corresponding switching elements or which also serve as the gate electrodes, each of the control lines being supplied with a selection signal for driving its corresponding switching element,
   at least one of the switching elements including an electrode which is connected with the input terminal and which includes a stem part and a plurality of branch parts extending from the stem part only, all of or art of the branch parts overlapping (i) a gate electrode connected with, among the control lines, a control line associated with said at least one switching element or (ii) the control line also serving as the gate electrode and (iii) a semiconductor layer of said at least one switching element, wherein
   in each of the plurality of signal distribution circuits,
   each of the switching elements comprises a first switching element and a second switching element which are connected in parallel,
   each of the first switching element and the second switching element is individually provided with a respective one of the control lines,
   said at least one switching element is the first switching element or the second switching element, and
   the first switching element and the second switching element share the electrode connected with the input terminal and the electrode connected with the respective one of the output terminals.

2. The signal distribution device as set forth in claim 1, wherein:
   said at least one switching element includes another electrode which is connected with a respective one of the output terminals and which includes a stem part and a plurality of branch parts extending from the stem part, only all of or part of the branch parts overlapping (i) the gate electrode connected with the control line or (ii) the control line also serving as the gate electrode and (iii) the semiconductor layer of said at least one switching element.

3. The signal distribution device as set forth in claim 1, wherein:
   each of the switching elements is a thin-film transistor including a semiconductor layer made of microcrystalline silicon, amorphous silicon, or oxide semiconductor.
4. A display device comprising a signal distribution device as set forth in claim 1.
5. The display device as set forth in claim 4, wherein:
   the display device includes a display panel including a display region and a peripheral region, and the signal distribution device is provided in the peripheral region.
6. A signal distribution device comprising a plurality of signal distribution circuits,
   each of the plurality of signal distribution circuits including (i) an input terminal to which an input signal is inputted and (ii) a plurality of distribution lines which are connected with the input terminal and which are connected with a respective plurality of output terminals via switching elements each made of a thin-film transistor,
   each of the plurality of signal distribution circuits distributing, to the plurality of output terminals via their corresponding switching elements, the input signal inputted to the input terminal,
   each of the plurality of signal distribution circuits including control lines which are connected with gate electrodes of their corresponding switching elements or which also serve as the gate electrodes, each of the control lines being supplied with a selection signal for driving its corresponding switching element,
   at least one of the switching elements including an electrode which is connected with the input terminal and which includes a stem part and a plurality of branch parts extending from the stem part, only all of or part of the branch parts overlapping (i) a gate electrode connected with, among the control lines, a control line associated with said at least one switching element or (ii) the control line also serving as the gate electrode and (iii) a semiconductor layer of said at least one switching element, wherein
   in each of the plurality of signal distribution circuits,
   each of the switching elements comprises a first switching element and a second switching element which are connected in parallel,
   each of the first switching element and the second switching element is individually provided with a respective one of the control lines,
   said at least one switching element is the first switching element or the second switching element, and
   one of the first switching element and the second switching element has an area smaller than that of the other of the first switching element and the second switching element.
7. The signal distribution device as set forth in claim 6, wherein:
   said at least one switching element includes another electrode which is connected with a respective one of the output terminals and which includes a stem part and a plurality of branch parts extending from the stem part, only all of or part of the branch parts overlapping (i) the gate electrode connected with the control line or (ii) the control line also serving as the gate electrode and (iii) the semiconductor layer of said at least one switching element.
8. The signal distribution device as set forth in claim 6, wherein:
   each of the switching elements is a thin-film transistor including a semiconductor layer made of microcrystalline silicon, amorphous silicon, or oxide semiconductor.
9. A display device comprising a signal distribution device as set forth in claim 6.
10. The display device as set forth in claim 9, wherein:
    the display device includes a display panel including a display region and a peripheral region, and the signal distribution device is provided in the peripheral region.
11. A signal distribution device comprising a plurality of signal distribution circuits,
    each of the plurality of signal distribution circuits including (i) an input terminal to which an input signal is inputted and (ii) a plurality of distribution lines which are connected with the input terminal and which are connected with a respective plurality of output terminals via switching elements each made of a thin-film transistor,
    each of the plurality of signal distribution circuits distributing, to the plurality of output terminals via their corresponding switching elements, the input signal inputted to the input terminal,
    each of the plurality of signal distribution circuits including control lines which are connected with gate electrodes of their corresponding switching elements or which also serve as the gate electrodes, each of the control lines being supplied with a selection signal for driving its corresponding switching element,
    at least one of the switching elements including an electrode which is connected with the input terminal and which includes a stem part and a plurality of branch parts extending from the stem part, only all of or part of the branch parts overlapping (i) a gate electrode connected with, among the control lines, a control line associated with said at least one switching element or (ii) the control line also serving as the gate electrode and (iii) a semiconductor layer of said at least one switching element, wherein
    in each of the plurality of signal distribution circuits,
    each of the switching elements comprises a first switching element and a second switching element which are connected in parallel,
    each of the first switching element and the second switching element is individually provided with a respective one of the control lines,
    said at least one switching element is the first switching element or the second switching element, and
    a timing at which one of the first switching element and the second switching element is turned off is later than a timing at which the other of the first switching element and the second switching element is turned off.
12. The signal distribution device as set forth in claim 11, wherein:
    said at least one switching element includes another electrode which is connected with a respective one of the output terminals and which includes a stem part and a plurality of branch parts extending from the stem part, only all of or part of the branch parts overlapping (i) the gate electrode connected with the control line or (ii) the control line also serving as the gate electrode and (iii) the semiconductor layer of said at least one switching element.
13. The signal distribution device as set forth in claim 11, wherein:
    each of the switching elements is a thin-film transistor including a semiconductor layer made of microcrystalline silicon, amorphous silicon, or oxide semiconductor.

14. A display device comprising a signal distribution device as set forth in claim 11.

15. The display device as set forth in claim 14, wherein:
the display device includes a display panel including a display region and a peripheral region, and the signal distribution device is provided in the peripheral region.

* * * * *